US 8,528,720 B2

(12) United States Patent
Mizukoshi et al.

(10) Patent No.: US 8,528,720 B2
(45) Date of Patent: Sep. 10, 2013

(54) SHUTTLE CONVEYOR, CIRCUIT-SUBSTRATE WORKING MACHINE, AND CIRCUIT-SUBSTRATE WORKING SYSTEM

(75) Inventors: Tsuyoshi Mizukoshi, Chiryu (JP); Mitsuaki Kato, Anjyo (JP)

(73) Assignee: Fuji Machine Mfg. Co., Ltd., Chiryu-Shi (JP)

( * ) Notice: Subject to any disclaimer, the term of this patent is extended or adjusted under 35 U.S.C. 154(b) by 0 days.

(21) Appl. No.: 13/816,851

(22) PCT Filed: Jul. 4, 2011

(86) PCT No.: PCT/JP2011/065270
§ 371 (c)(1),
(2), (4) Date: Feb. 13, 2013

(87) PCT Pub. No.: WO2012/023351
PCT Pub. Date: Feb. 23, 2012

(65) Prior Publication Data
US 2013/0140136 A1      Jun. 6, 2013

(30) Foreign Application Priority Data

Aug. 19, 2010    (JP) ................................ 2010-184239

(51) Int. Cl.
*B65G 37/00*    (2006.01)
(52) U.S. Cl.
USPC ........................... 198/358; 198/349; 198/437
(58) Field of Classification Search
USPC ...... 198/358, 346.2, 349, 437, 444; 700/230; 414/217
See application file for complete search history.

(56) References Cited

U.S. PATENT DOCUMENTS

| 4,483,651 | A  | * | 11/1984 | Nakane et al. ................. 414/217 |
| 4,681,208 | A  | * | 7/1987  | Harringer et al. ........ 198/341.05 |
| 6,854,583 | B1 | * | 2/2005  | Horn ............................. 198/348 |
| 7,413,069 | B2 | * | 8/2008  | Brill et al. ..................... 198/358 |
| 8,024,065 | B2 | * | 9/2011  | Brill et al. ..................... 700/230 |

(Continued)

FOREIGN PATENT DOCUMENTS

| JP | A-7-176588    | 7/1995  |
| JP | A-2001-308595 | 11/2001 |

(Continued)

OTHER PUBLICATIONS

Aug. 9, 2011 International Search Report issued in International Application No. PCT/JP2011/065270.

(Continued)

*Primary Examiner* — James R Bidwell
(74) *Attorney, Agent, or Firm* — Oliff & Berridge, PLC

(57) ABSTRACT

Utility of a circuit-substrate working machine including a substrate conveyor device and a shuttle conveyor designed to shift a circuit substrate in a direction intersecting a conveying direction is improved. Based on transmission of a deliverable-state advance notification signal for one of conveyor lanes of an upstream printer, a movable conveyor lane of an intermediate shuttle conveyor is moved to a position continuous to the one conveyor lane. The circuit substrate is delivered to the movable conveyor lane in a state in which the movable conveyor lane is located at a circuit-substrate receiving position, a receivable-state advance notification signal is produced for a receiving lane for receiving the circuit substrate supplied from one of conveyor lanes of a downstream printer which has transmitted a deliverable-state advance notification signal, and a receivable-state signal and a deliverable-state signal are obtained. The circuit substrate is then delivered to the receiving lane.

14 Claims, 12 Drawing Sheets

(56) References Cited

U.S. PATENT DOCUMENTS

| | | | |
|---|---|---|---|
| 8,245,834 B2* | 8/2012 | Okubo et al. | 198/358 |
| 2005/0133340 A1* | 6/2005 | Horn | 198/348 |
| 2009/0139833 A1* | 6/2009 | Ogura et al. | 198/358 |
| 2011/0180588 A1 | 7/2011 | Nagao | |

FOREIGN PATENT DOCUMENTS

| | | |
|---|---|---|
| JP | A-2002-57200 | 2/2002 |
| JP | A-2004-134691 | 4/2004 |
| JP | A-2008-192785 | 8/2008 |
| JP | A-2010-87449 | 4/2010 |
| WO | WO 2010/038439 A1 | 4/2010 |

OTHER PUBLICATIONS

Mar. 19, 2013 International Preliminary Report on Patentability issued in International Application No. PCT/JP2011/065270.

* cited by examiner

SHUTTLE CONVEYOR, CIRCUIT-SUBSTRATE WORKING MACHINE, AND CIRCUIT-SUBSTRATE WORKING SYSTEM

TECHNICAL FIELD

The present invention relates to a shuttle conveyor configured to shift a circuit substrate in a direction intersecting a conveying direction, a circuit-substrate working machine including a substrate conveyor device, and a circuit-substrate working system including the shuttle conveyor and the circuit-substrate working machine.

BACKGROUND ART

A conveyor device is provided and a conveyance object is conveyed on various working machines such as a circuit-substrate working machine configured to perform operations including printing of a printing material on a circuit substrate and mounting of electronic circuit components on the circuit substrate. For example, each of systems disclosed in the following Patent Documents 1, 2 includes: a plurality of processing devices each configured to perform a processing on a wafer; and a conveyor robot configured to convey the wafer between the processing devices, and the system is configured such that completion of the processing by the processing device is notified in advance a set length of time before the completion of the processing, and the conveyor robot is moved to the processing device before the completion of the processing. Thus, the conveyor robot can receive and convey the wafer immediately after the completion of the processing.

PRIOR ART DOCUMENTS

Patent Documents

Patent Document 1: JP-A-7.176588
Patent Document 2: JP-A-2002-57200

SUMMARY OF THE INVENTION

Problem to be Solved by the Invention

The present invention has been developed in view of the above-described situations to solve a problem of improving utility of a shuttle conveyor configured to shift a circuit substrate in a direction intersecting a conveying direction, a circuit-substrate working machine including a substrate conveyor device, and a circuit-substrate working system including the shuttle conveyor and the circuit-substrate working machine.

Means for Solving Problem

The above-described problem is solved by a shuttle conveyor provided downstream of an upstream device comprising a multi-lane conveyor device comprising a plurality of conveyor lanes each for conveying a circuit substrate from an upstream side toward a downstream side, the shuttle conveyor comprising: a movable conveyor lane; and a shifting device configured to shift the movable conveyor lane in a direction intersecting a conveying direction in which the movable conveyor lane conveys the circuit substrate, wherein the shuttle conveyor further comprises an advance-shift control unit configured, when deliverable-state advance notification information is obtained for one of the plurality of conveyor lanes of the upstream device before the one becomes a state in which the circuit substrate is deliverable, to have the shifting device shift the movable conveyor lane to a position at which the circuit substrate is receivable by the movable conveyor lane from the one of the plurality of conveyor lanes, the deliverable-state advance notification information being a notification which notifies in advance that the one is to become the state in which the circuit substrate is deliverable.

The above-described problem is also solved by a shuttle conveyor provided between a downstream device and an upstream device comprising a multi-lane conveyor device comprising a plurality of conveyor lanes each for conveying a circuit substrate from an upstream side toward a downstream side, the shuttle conveyor comprising: a movable conveyor lane; and a shifting device configured to shift the movable conveyor lane in a direction intersecting a conveying direction in which the movable conveyor lane conveys the circuit substrate, wherein the shuttle conveyor further comprises a receipt control unit configured, when a circuit substrate is present on one of the plurality of conveyor lanes, and receivable-state advance notification information is obtained from the downstream device before the downstream device becomes a state in which the circuit substrate is receivable, to have the movable conveyor lane receive the circuit substrate from the one of the plurality of conveyor lanes, the receivable-state advance notification information being a notification which notifies in advance that the downstream device is to become the state in which the circuit substrate is receivable.

The above-described problem is also solved by a shuttle conveyor provided between an upstream device and a downstream device and comprising a movable conveyor lane and a shifting device configured to shift the movable conveyor lane in a direction intersecting a conveying direction in which the movable conveyor lane conveys the circuit substrate, wherein the shuttle conveyor further comprises: (A) an advance-shift control unit configured, when deliverable-state advance notification information is obtained from the upstream device before the upstream device becomes a state in which a circuit substrate is deliverable, to have the shifting device shift the movable conveyor lane to a position at which the circuit substrate is receivable by the movable conveyor lane from the upstream device, the deliverable-state advance notification information being a notification which notifies in advance that the upstream device is to become the state in which the circuit substrate is deliverable; and (B) a receipt control unit configured, when a circuit substrate is present on the upstream device, and receivable-state advance notification information is obtained from the downstream device before the downstream device becomes a state in which the circuit substrate is receivable, to have the movable conveyor lane receive the circuit substrate from the upstream device, the receivable-state advance notification information being a notification which notifies in advance that the downstream device is to become the state in which the circuit substrate is receivable.

The above-described problem is also solved by a circuit-substrate working machine comprising: (α) a substrate conveyor device configured to convey a circuit substrate from an upstream side toward a downstream side; (β) a working device configured to perform a circuit substrate operation on the circuit substrate conveyed by the substrate conveyor device; and (γ) a deliverable-state advance-notification-information producing unit configured to produce deliverable-state advance notification information a first set length of time before a timing at which the working device is expected to finish the circuit substrate operation, wherein the substrate conveyor device is a multi-lane conveyor device comprising a plurality of conveyor lanes each for conveying the circuit substrate from the upstream side toward the downstream side, and wherein the deliverable-state advance-notification-information producing unit is configured to produce the deliverable-state advance notification information for at least one of the plurality of conveyor lanes which conveys the circuit substrate to the working device.

The above-described problem is also solved by a circuit-substrate working machine comprising: (I) a substrate conveyor device configured to convey a circuit substrate from an upstream side toward a downstream side; (II) a working device configured to perform a circuit substrate operation on the circuit substrate conveyed by the substrate conveyor device; and (III) receivable-state advance-notification-information producing unit configured to produce receivable-state advance notification information a second set length of time before a timing at which the working device is expected to finish the circuit substrate operation, wherein the substrate conveyor device is a multilane conveyor device comprising a plurality of conveyor lanes each for conveying the circuit substrate from the upstream side toward the downstream side, and wherein the receivable-state advance-notification-information producing unit is configured to produce the receivable-state advance notification information for at least one of the plurality of conveyor lanes which conveys the circuit substrate to the working device.

The second set length of time and the first set length of time may or may not be equal to each other.

The above-described problem is also solved by a shuttle conveyor provided between an upstream device comprising a multi-lane conveyor device comprising a plurality of conveyor lanes each for conveying a circuit substrate from an upstream side toward a downstream side and a downstream device comprising a multi-lane conveyor device comprising a plurality of conveyor lanes each for conveying a circuit substrate from the upstream side toward the downstream side, the shuttle conveyor comprising: a movable conveyor lane; and a shifting device configured to selectively shift the movable conveyor lane to one of a plurality of positions respectively continuous to the plurality of conveyor lanes of the multilane conveyor device of the upstream device and the plurality of conveyor lanes of the multilane conveyor device of the downstream device, wherein the shuttle conveyor comprises at least one of: (i) an advance-shift control unit configured, when deliverable-state advance notification information is obtained from one of the plurality of conveyor lanes of the upstream device, to shift the movable conveyor lane to a position continuous to the one of the plurality of conveyor lanes, the deliverable-state advance notification information being a notification which notifies in advance that the one of the plurality of conveyor lanes is to become a state in which the circuit substrate is deliverable; and (ii) a receipt control unit configured, when a circuit substrate is present on one of the plurality of conveyor lanes of the upstream device, and receivable-state advance notification information is obtained from one of the plurality of conveyor lanes of the downstream device, to have the movable conveyor lane receive the circuit substrate from the one of the plurality of conveyor lanes of the upstream device, the receivable-state advance notification information being a notification which notifies in advance that the one of the plurality of conveyor lanes of the upstream device is to become a state in which the circuit substrate is receivable.

Effect of the Invention

In the shuttle conveyor including the above-described advance-shift control unit, the movable conveyor lane is shifted to the position at which the movable conveyor lane can receive the circuit substrate before the upstream device becomes the state in which the upstream device can deliver the circuit substrate. Thus, a length of time required for the receipt of the circuit substrate is shortened when compared with a case where the movable conveyor lane is shifted after the circuit substrate becomes deliverable.

For the substrate conveyor system including a plurality of substrate conveyors arranged in a row, there is a standard called SMEMA Electrical Equipment Interface Standard (hereinafter simply referred to as "SMEMA standard") which defines that, in a case where a signal indicating that there is a deliverable circuit substrate, namely a deliverable-state signal, is supplied from an upstream one of the substrate conveyors, and a signal indicating that the circuit substrate can be received, namely a receivable-state signal, is supplied from a downstream one of the substrate conveyors, both of the upstream and downstream substrate conveyors are operated to deliver and receive the circuit substrate. According to the standard, the delivery and receipt operation of the circuit substrate is performed immediately after the circuit substrate becomes deliverable and receivable. This avoids unnecessary driving of the substrate conveyor and achieves reliable delivery and receipt of the circuit substrate without delay.

In conventional techniques, the SMEMA standard is applied also to a case where the substrate conveyor is a shuttle conveyor, but the present inventors have found that the shuttle conveyor may not always perform ideal delivery and receipt. According to the SMEMA standard, the delivery and receipt operation of the circuit substrate is performed only after the deliverable-state signal and the receivable-state signal are respectively supplied from the upstream substrate conveyor and the shuttle conveyor. However, in a case where the movable conveyor lane is not located at a position continuous to the upstream substrate conveyor, it is required that the movable conveyor lane is shifted to the position and then the conveyors are driven, resulting in that a length of time required for the delivery and receipt is made longer by a length of time required for the shift.

In the shuttle conveyor including the advance-shift control unit, however, the timing of production of the deliverable-state advance notification information is adjusted to eliminate or reduce the unnecessary time, ranking it possible to always speedily perform the delivery and receipt of the circuit substrate.

It is noted that the term "deliverable-state advance notification information" is used without using the term "deliverable-state advance notification signal" in the shift conveyor including the advance-shift control unit, because controls according to the SMEMA standard are possible also in a case where the upstream substrate conveyor and the downstream substrate conveyor are controlled by a single compute; and the present invention embraces such a form. In that case, since the term "signal" seems not always to be appropriate to represent an object indicating a deliverable-state advance notification in the compute; the term "information" is used. Therefore, the "deliverable-state advance notification information" includes not only "information representative of the deliverable-state advance notification signal" but also the "deliverable-state advance notification information" produced in the computer. This is applied to the "receivable-state advance notification information".

In general, the shuttle conveyor provided between the upstream device and the downstream device helps the delivery and receipt of the circuit substrate between the upstream device and the downstream device to enable the delivery and receipt of the circuit substrate therebetween regardless of the circuit-substrate delivery position of the upstream device and the circuit-substrate receiving position of the downstream device in a direction of the shift. In a case where the movable conveyor lane receives the circuit substrate from the upstream device in the state in which the downstream device can receive the circuit substrate, it is possible to avoid a situation in which the movable conveyor lane receives and holds the circuit substrate even though the circuit substrate is not receivable by the downstream device. However, before an appropriate length of time in advance of a timing when the downstream device is expected to become the state in which the downstream device can receive the circuit substrate, the downstream device can be considered to be in the state in which the downstream device can receive the circuit substrate, and the movable conveyor lane can receive the circuit substrate from the upstream device before the downstream device becomes the state in which the downstream device can receive the circuit substrate, resulting in reduction in a length of time required for the downstream device to receive the circuit substrate.

As explained later in the embodiments, the shift of the movable conveyor lane having received the circuit substrate from the circuit-substrate delivery position of the upstream device to the circuit-substrate receiving position of the downstream device (i) can be a part of the delivery and receipt operation of the circuit substrate according to the SMEMA standard (i.e., the delivery and receipt operation of the circuit substrate which is performed in the state in which the deliverable-state information and the receivable-state information have been produced) and (ii) can be not included in the delivery and receipt operation and the completion of the shift can be set as a condition for production of the deliverable-state information, but since the obtainment of the two informations is a condition for the delivery and receipt, in the case (i) the obtainment of the two informations is a condition for starting the shift, while in the case (ii) the shift can be performed without the obtainment of the two informations as long as the circuit substrate is received by the movable conveyor lane. Thus, where the shuttle conveyor is designed to include the receipt control unit, in the case (ii) the shuttle conveyor receives the circuit substrate on the basis of the advance notification, whereby a length of time between the timing of production of the receivable-state advance notification information and the timing of production of the receivable-state information can be used for the shift of the movable conveyor lane in addition to the receipt of the circuit substrate. In addition, since the upstream device has the plurality of conveyor lanes, even if a distance of the movement of the movable conveyor lane is long, it is possible to effectively suppress increase in the length of time required for the downstream device to receive the circuit substrate.

In the above-described shuttle conveyor including both of the advance-shift control unit and the receipt control unit, the time required for the delivery and receipt of the circuit substrate between the upstream device and the downstream device is shortened by both of the movement of the movable conveyor lane on the basis of the deliverable-state advance notification information and the receipt of the circuit substrate from the upstream device on the basis of the receivable-state advance notification information.

In the above-described circuit-substrate working machine including the deliverable-state advance-notification-information producing unit, production of the deliverable-state advance notification information can cause a device for receiving the circuit substrate from the substrate conveyor device to make preparation for receiving the circuit substrate. In particular, in a case where the substrate conveyor device includes a plurality of conveyor lanes, where the deliverable-state advance notification information is produced for each of the plurality of conveyor lanes, the receiving preparation can be made even where any of the conveyor lanes delivers the circuit substrate.

In the above-described circuit-substrate working machine including the receivable-state advance-notification-information producing unit, production of the receivable-state advance notification information can cause a device for delivering the circuit substrate to the substrate conveyor device of the circuit-substrate working machine to make preparation for delivering the substrate. In particular, in the case where the substrate conveyor device includes a plurality of conveyor lanes, where the receivable-state advance notification information is produced for each of the plurality of conveyor lanes, the delivery preparation can be made even where the circuit substrate is delivered to any of the conveyor lanes.

In the above-described shuttle conveyor including the advance-shift control unit and the receipt control unit and provided between the upstream device and the downstream device each including the multi-lane conveyor device, it is possible not only to obtain effect achieved by the advance-shift control unit and the receipt control unit but also to suppress decrease in an operating rate of each of the upstream and downstream devices. If the receivable-state advance notification information is not produced, the movable conveyor lane can be moved, on the basis of the deliverable-state advance notification information, to the position at which the movable conveyor lane can receive the circuit substrate from one of the plurality of conveyor lanes of the upstream device, but the movable conveyor lane cannot receive the circuit substrate on the basis of the deliverable-state information supplied from the upstream device as long as the receivable-state information is transmitted from the downstream device. In this case, the length of time required for the downstream device to receive the circuit substrate is unfortunately made longer by a length of time required for the movable conveyor lane to receive the circuit substrate from the upstream device. To solve this problem, it can be considered that the deliverable-state advance notification information is used to cause the movable conveyor lane not only to move to the position at which the movable conveyor lane can receive the circuit substrate from one of the plurality of conveyor lanes of the upstream device but also to receive the circuit substrate, but in this case there is a possibility that waiting time is produced for the upstream device or the downstream device. For example, even in a case where conveyor lanes to perform the delivery and receipt of the circuit substrate are determined in advance for the plurality of conveyor lanes of the upstream and downstream devices, and the order of delivery and the order of receipt are normally determined in advance, the circuit substrates may not be discharged in the predetermined order, or the receipt of the circuit substrates may not be enabled in the predetermined order. In this case, the movable conveyor lane having received the circuit substrate has to wait for the conveyor lane for receiving the circuit substrate to become a state in which the conveyor lane can receive the circuit substrate, or even if there is a conveyor lane of the downstream device which has become the state in which the conveyor lane can receive the circuit substrate, the movable conveyor lane has to wait for the circuit substrate for the conveyor lane to be delivered from the upstream device to the movable conveyor lane, resulting in a lower operating rate. However, since the receivable-state advance notification information is produced for the plurality of conveyor lanes of the downstream device in the order in which the receipt of the circuit substrate is enabled, the movable conveyor lane receives the circuit substrates according to the produced receivable-state advance notification information, whereby it is possible to reduce occurrence of a conveyor lane that has to wait even though the conveyor lane can receive the circuit substrate or a conveyor lane that has to wait even though the conveyor lane can deliver the circuit substrate to the movable conveyor lane, thereby suppressing the lowering of the operating rate.

Forms of the Invention

There will be described by way of examples forms of inventions recognized to be claimable by the present applicant. The inventions may be hereinafter referred to as "claimable inventions", and include the invention as defined in the appended claims (which may be referred to as "the invention" or "the invention of the present application"), an invention of a concept subordinate or superordinate to the concept of the invention of the present application, and/or an invention of a concept different from the concept of the invention of the present application. The forms are numbered like the appended claims and depend on another form or forms, where appropriate. This is for easier understanding of the claimable invention, and it is to be understood that combinations of constituent elements that constitute the claimable inventions are not limited to those of the following forms. That is, the claimable inventions are to be construed by taking account of the description following each form, the description of the embodiments, the related art, the common general technical knowledge, and others, and as long as the claimable inventions are constructed in this way, any form in which one or more elements are added to or deleted from any one of the following forms may be considered as one form of the claimable invention.

In the following forms, the form (2) corresponds to claim 1, the form (12) corresponds to claim 2, the form (21) corresponds to claim 3, the form (53) corresponds to claim 4, the form (32) corresponds to claim 5, the form (34) corresponds to claim 6, the form (41) corresponds to claim 7, the form (42) corresponds to claim 8, the form (43) corresponds to claim 9, the form (44) corresponds to claim 10, the form (45) corresponds to claim 11, the form (48) corresponds to claim 12, the form (47) corresponds to claim 13, and the form (48) corresponds to claim 14.

(1) A shuttle conveyor provided downstream of an upstream device and comprising: a movable conveyor lane; and a shifting device configured to shift the movable conveyor lane in a direction intersecting a Conveying direction in which the movable conveyor lime conveys the circuit substrate, wherein the shuttle conveyor further comprises an advance-shift control unit configured, when deliverable-state advance notification information is obtained from the upstream device before the upstream device becomes a state in which the circuit substrate is deliverable, to have the shifting device shift the movable conveyor lane to a position at which the circuit substrate is receivable by the movable conveyor lane from the upstream device, the deliverable-state advance notification information being a notification which notifies in advance that the upstream device is to become the state in which the circuit substrate is deliverable.

(2) The shuttle conveyor according to the above form (1), wherein in a case where the upstream device comprises a multilane conveyor device comprising a plurality of conveyor lanes each for conveying the circuit substrate from an upstream side toward a downstream side, when the deliverable-state advance notification information is obtained for one of the plurality of conveyor lanes of the upstream device, the advance-shift control unit has the shifting device shift the movable conveyor lane to a position at which the circuit substrate is receivable by the movable conveyor lane from the one of the plurality of conveyor lanes.

(3) A substrate conveyor system comprising the shuttle conveyor according to the above form (2) and the upstream device.

The shuttle conveyor of the substrate conveyor system according to the present form may be a shuttle conveyor according to the above form (1). In the form (1), the upstream device may be a device including a single-lane conveyor device having a single conveyor lane.

(4) A circuit-substrate working system comprising:
the substrate conveyor system according to the above form (3);
a working device configured to perform a circuit substrate operation on the circuit substrate loaded by at least one of the plurality of conveyor lanes of the multi-lane conveyor device, and
a deliverable-state advance-notification-information producing unit configured to produce the deliverable-state advance notification information a first set length of time before a timing at which the working device is expected to finish the circuit substrate operation.

The working device and the advance-notification-information producing unit can be considered to constitute the upstream device with a substrate conveyor device. Also, it is possible to consider that the upstream device is constituted by the substrate conveyor device, and the working device and the advance-notification-information producing unit are additionally provided on a substrate conveyor system including the substrate conveyor device and a shuttle conveyor.

(11) A shuttle conveyor provided between an upstream device and a downstream device and comprising: a movable conveyor lane; and a shifting device configured to shift the movable conveyor lane in a direction intersecting a conveying direction in which the movable conveyor lane conveys the circuit substrate, wherein the shuttle conveyor further comprises a receipt control unit configured, when receivable-state advance notification information is obtained from the downstream device before the downstream device becomes a state in which the circuit substrate is receivable, to have the movable conveyor lane receive the circuit substrate from the upstream device, the receivable-state advance notification information being a notification which notifies in advance that the downstream device is to become the state in which the circuit substrate is receivable,

(12) The shuttle conveyor according to the above form (11), wherein the upstream device comprises a multi-lane conveyor device comprising a plurality of conveyor lanes each for conveying the circuit substrate from an upstream side toward a downstream side, and wherein the receipt control unit is configured, when a circuit substrate is present on one of the plurality of conveyor lanes, and the receivable-state advance notification information is obtained, to have the movable conveyor lane receive the circuit substrate from the one of the plurality of conveyor lanes.

(18) The shuttle conveyor according to the above form (11) or (12), wherein the downstream device comprises:
a multi-lane conveyor device comprising a plurality of conveyor lanes each for conveying the circuit substrate from an upstream side toward a downstream side; and
a receivable-state advance-notification-information producing unit configured to produce the receivable-state advance notification information before one of the plurality of conveyor lanes becomes the state in which the circuit substrate is receivable.

In a form in which the present form depends on the form (12), it is possible to obtain effects similar to those obtained by a shuttle conveyor according to the form (53).

In a form in which the present form depends on the form (11), the upstream device may be a device including a single-lane conveyor device having a single conveyor lane. In this case, the movable conveyor lane receives the circuit substrate from the single conveyor lane of the upstream device and delivers the circuit substrate to one of the plurality of conveyor lanes of the downstream device. Thus, in a case where a delivery and receipt operation does not include a shift of the movable conveyor lane having received; the circuit substrate, it is possible to obtain effect of receiving the circuit substrate on the basis of production of the receivable-state advance notification information. In addition, even where the downstream device is a multi-lane conveyor device that requires the movable conveyor lane to move within a large area and for a long distance, it is possible to effectively obtain effect of shortened time of delivery and receipt of the circuit substrate between the upstream device and the downstream device by allotting a length of time between the production of the receivable-state advance notification information and the production of the receivable-state information to the movement of the movable conveyor lane.

(14) A substrate conveyor system comprising the shuttle conveyor according to any one of the above forms (11) through (13), the upstream device, and the downstream device.

(15) A circuit-substrate working system comprising:
the substrate conveyor system according to the above form (14); and
a working device configured to perform a circuit substrate operation on the circuit substrate that is received by the downstream device from the shuttle conveyor.

(21) A shuttle conveyor provided between an upstream device and a downstream device and comprising a movable conveyor lane and a shifting device configured to shift the movable conveyor lane in a direction intersecting a conveying direction in which the movable conveyor lane conveys the circuit substrate,
wherein the shuttle conveyor further comprises:
an advance-shift control unit configured, when deliverable-state advance notification information is obtained from the upstream device before the upstream device becomes a state in which a circuit substrate is deliverable, to have the shifting device shift the movable conveyor lane to a position at which the circuit substrate is receivable by the movable conveyor lane from the upstream device, the deliverable-state advance notification information being a notification which notifies in advance that the upstream device is to become the state in which the circuit substrate is deliverable;
a receipt control unit configured, when a circuit substrate is present on the upstream device, and receivable-state advance notification information is obtained from the downstream device before the downstream device becomes a state in which the circuit substrate is receivable, to have the movable conveyor lane receive the circuit substrate from the upstream device, the receivable-state advance notification information being a notification which notifies in advance that the downstream device is to become the state in which the circuit substrate is receivable.

The shuttle conveyor according to the present form can adopt at least one of the feature described in the form (2) and a feature described in the form (12) or (13).

(31) A circuit-substrate working machine comprising:
a substrate conveyor device configured to convey a circuit substrate from an upstream side toward a downstream side;
a working device configured to perform a circuit substrate operation on the circuit substrate conveyed by the substrate conveyor device; and
a deliverable-state advance-notification-information producing unit configured to produce deliverable-state advance notification information a first set length of time before a timing at which the working device is expected to finish the circuit substrate operation.

The substrate conveyor device may be a multi-lane conveyor device as a substrate conveyor device described in the next form and may be a single-lane conveyor device having a single conveyor lane. In the latter case, the production of the deliverable-state advance notification information allows a substrate receiving preparation of a device that is to receive the circuit substrate to be delivered from the single-lane conveyor device, resulting in shortened delivery time and receiving time.

(32) The circuit-substrate working machine according to the above form OD,
wherein the substrate conveyor device is a multi-lane conveyor device comprising a plurality of conveyor lanes each for conveying the circuit substrate from the upstream side toward the downstream side, and
wherein the deliverable-state advance-notification-information producing unit is configured to produce the deliverable-state advance notification information for at least one of the plurality of conveyor lanes which conveys the circuit substrate to the working device.

In the present specification, the circuit substrate operation includes: printing of solder; application of adhesive; mounting of electronic circuit components, and an inspection of the circuit substrate for which the printing, the application, and the mounting are finished.

The circuit-substrate working machine according to the present form may be a machine designed such that all the plurality of conveyor lanes of the multi-lane conveyor device selectively convey the circuit substrate to the working device and may be a machine designed such that some of the plurality of conveyor lanes convey the circuit substrate to the working device but the other conveyor lanes do not convey the circuit substrate to the working device. That is, some conveyor lanes may simply convey the circuit substrate therethrough, for example. For the plurality of conveyor lanes that are to convey the circuit substrate to the working device, the deliverable-state advance-notification-information producing unit can produce the deliverable-state advance notification information, but the deliverable-state advance-notification-information producing unit may or may not produce the deliverable-state advance notification information for the conveyor lanes that are not to convey the circuit substrate to the working device. In the case where the deliverable-state advance notification information is produced for the conveyor lanes that are not to convey the circuit substrate to the working device, timings of the production of the deliverable-state advance notification information therefor can be the same or different from those for the conveyor lanes that are to convey the circuit substrate to the working device.

(33) A circuit-substrate working machine comprising:
a substrate conveyor device configured to convey a circuit substrate from an upstream side toward a downstream side;
a working device configured to perform a circuit substrate operation on the circuit substrate conveyed by the substrate conveyor device; and a receivable-state advance-notification-information producing unit configured to produce receivable-state advance notification information a second set length of time before a timing at which the working device is expected to finish the circuit substrate operation. The substrate conveyor device may be a multi-lane conveyor device and may be a single-lane conveyor device. In the latter case, the production of the receivable-state advance notification information allows a device for delivering the circuit substrate onto the conveyor lane to prepare for delivering the circuit substrate, resulting in shortened delivery time and receipt time.

(34) The circuit-substrate working machine according to the above form (33),
wherein the substrate conveyor device is a multi-lane conveyor device comprising a plurality of conveyor lanes each for conveying the circuit substrate from the upstream side toward the downstream side, and
wherein the receivable-state advance-notification-information producing unit is configured to produce the receivable-state advance notification information for at least one of the plurality of conveyor lanes which conveys the circuit substrate to the working device.

The explanation for the above form (32) can be applied to the circuit-substrate working machine according to the present form by reading the deliverable-state advance notification information as the receivable-state advance notification information.

(41) A circuit-substrate working system comprising:
an upstream circuit-substrate working machine comprising: (a) a substrate conveyor device configured to convey a circuit substrate from an upstream side toward a downstream side; (b) a working device configured to perform a circuit substrate operation on the circuit substrate conveyed by the substrate conveyor device; and (c) a deliverable-state advance-notification-information producing unit configured to produce deliverable-state advance notification information a first set length of time before a timing at which the working device is expected to finish the circuit substrate operation;
a downstream circuit-substrate working machine comprising: (d) a substrate conveyor device configured to convey a circuit substrate from the upstream side toward the downstream side; (e) a working device configured to perform a circuit substrate operation on the circuit substrate conveyed by the substrate conveyor device; (f) a receivable-state advance-notification-information producing unit configured to produce receivable-state advance notification information a second set length of time before a timing at which the working device is expected to finish the circuit substrate operation;
(g) a shuttle conveyor provided between the upstream circuit-substrate working machine and the downstream circuit-substrate working machine and comprising a movable conveyor lane and a shifting device configured to shift the movable conveyor lane in a direction intersecting a conveying direction in which the movable conveyor lane conveys the circuit substrate;
(h) an advance-shift control unit configured, when the deliverable-state advance notification information is obtained from the upstream device, to have the shifting device shift the movable conveyor lane to a position at which the circuit substrate is receivable by the movable conveyor lane from the upstream device; and
(i) a receipt control unit configured, when a circuit substrate is present on the upstream device, end the receivable-state advance notification information is obtained from the downstream device, to have the movable conveyor lane receive the circuit substrate from the upstream device.

In the substrate conveyor device, at least one of the upstream circuit-substrate working machine and the downstream circuit-substrate working machine may be a single-lane conveyor device and may be a multi-lane conveyor device.

In the circuit-substrate working system according to the present form, it is possible to obtain both of effect achieved by the advance-shift control unit and effect achieved by the receipt control unit.

(42) The circuit-substrate working system according to the above form (41),
wherein each of the substrate conveyor device of the upstream circuit-substrate working machine and the substrate conveyor device of the downstream circuit-substrate working machine is a multi-lane conveyor device comprising a plurality of conveyor lanes each for conveying a circuit substrate from the upstream side toward the downstream side,
wherein the advance-slat control unit is configured, when the deliverable-state advance notification information is obtained for one of the plurality of conveyor lanes of the upstream circuit-substrate working machine, to have the shifting device shift the movable conveyor lane to a position at which the circuit substrate is receivable by the movable conveyor lane from the one of the plurality of conveyor lanes, and
wherein the receipt control unit is configured, when the receivable-state advance notification information is obtained for one of the plurality of conveyor lanes of the downstream circuit-substrate working machine, to have the movable conveyor lane receive the circuit substrate from the substrate conveyor device of the upstream circuit-substrate working machine at the position at which the movable conveyor lane has been shifted by the advance-shift control unit.

The explanation for the forms (32), (34) can be applied to the circuit-substrate working system according to the present form, and effect obtained by the shuttle conveyor according to the above form (53) can also be obtained in the circuit-substrate working system according to the present form.

(43) The circuit-substrate working system according to the above form (42), wherein each of the upstream circuit-substrate working machine and the downstream circuit-substrate working machine is configured to perform the same kind of operation on a circuit substrate on a frontmost one of the plurality of conveyor lanes of the multi-lane conveyor device.

The working device of each of the upstream and downstream circuit-substrate working machines is provided to perform the same kind of operation on the frontmost conveyor lane. Thus, the operator can easily access the working device of each of the two circuit-substrate working machines from its front side to perform operations such as maintenance checkup. This configuration is effective in particular in a case where it is difficult for the operator to access the working device from its rear side, for example, in a case where the circuit-substrate working machine is provided along a wall face or where the circuit-substrate working machine and another machine are provided back to back.

(44) The circuit-substrate working system according to any one of the above forms (41) through (43), wherein a shuttle-conveyor control unit configured to control the shuttle conveyor is provided on at least one of the upstream circuit-substrate working machine and the downstream circuit-substrate working machine.

The smaller number of control units are required when compared with a case where the shuttle-conveyor control unit is provided on the shuttle conveyor.

(45) The circuit-substrate working system according to any one of the above forms (41) through (43), wherein the shuttle conveyor comprises a shuttle-conveyor control unit configured to control the shuttle conveyor, and wherein the shuttle-conveyor control unit and at least one of the upstream circuit-substrate working machine and the downstream circuit-substrate working machine are coupled to each other by a signal line that transmits and receives a signal representative of at least one of the deliverable-state advance notification information and the receivable-state advance notification information.

A circuit-substrate working system including a shuttle conveyor independent of the circuit-substrate working machine can also perform the delivery and receipt of the circuit substrate by the transmission and receipt of the signal representative of the advance notification information.

(46) The circuit-substrate working system according to the above form (44) or (45), wherein another shuttle conveyor different from the shuttle conveyor is provided on at least one of an upstream side of the upstream circuit-substrate working machine and a downstream side of the downstream circuit-substrate working machine, said another shuttle conveyor comprising a shuttle-conveyor control unit configured to control said another shuttle conveyor, and wherein the shuttle-conveyor control unit and the at least one of the upstream circuit-substrate working machine and the downstream circuit-substrate working machine are coupled to each other by a signal this that transmits and receives a signal representative of at least one of the deliverable-state advance notification information and the receivable-state advance notification information.

(47) The circuit-substrate working system according to the above form (44) or (45), wherein another shuttle conveyor different from the shuttle conveyor is provided on at least one of an upstream side of the upstream circuit-substrate working machine and a downstream side of the downstream circuit-substrate working machine, and wherein a shuttle-conveyor control unit configured to control said another shuttle conveyor is provided on the at least one of the upstream circuit-substrate working machine and the downstream circuit-substrate working machine.

The circuit substrate can be loaded onto the upstream circuit-substrate working machine by the shuttle conveyor, and/or the shuttle conveyor can receive the circuit substrate from, the downstream circuit-substrate working machine.

(48) The circuit-substrate working system according to the above form (45) or (46), wherein at least one of the upstream circuit-substrate working machine and the downstream circuit-substrate working machine comprises at least one of a deliverable-state information producing unit configured to produce deliverable-state information when the at least one of the upstream circuit-substrate working machine and the downstream circuit-substrate working machine completes the circuit substrate operation; and a receivable-state information producing unit configured to produce receivable-state information when the at least one of the upstream circuit-substrate working machine and the downstream circuit-substrate working machine completes the circuit substrate operation, and wherein the at least one of the upstream circuit-substrate working machine and the downstream circuit-substrate working machine is configured to transmit a signal representative of the deliverable-state information and a signal representative of the deliverable-state advance notification information, or a signal representative of the receivable-state information and a signal representative of the receivable-state advance notification information, to the signal line in different manners.

This results in the reduced number of signal lines and reduced cost.

(49) The circuit-substrate working system according to any one of the above forms (41) through (48), wherein at least one of the upstream circuit-substrate working machine and the downstream circuit-substrate working machine is a screen printing machine configured to print a printing material on the circuit substrate through a mask having a through hole.

(51) A substrate conveyor system comprising:

at least one of an upstream device comprising a multi-lane conveyor device comprising a plurality of conveyor lanes each for conveying a circuit substrate from an upstream side toward a downstream side and a downstream device comprising a multi-lane conveyor device comprising a plurality of conveyor lanes each for conveying a circuit substrate from the upstream side toward the downstream side; and a shuttle conveyor provided adjacent to the at least one of the upstream device and the downstream device and comprising a movable conveyor lane and a shifting device configured to shift the movable conveyor lane selectively to one of at least two positions respectively continuous to at least two of the plurality of conveyor lanes of the multi-lane conveyor device of the at least one of the upstream device and the downstream device.

The present substrate conveyor system can adopt the feature of each of the forms (2) through (4), the forms (12) through (15), the form (21), the forms (31) through (34), and the forms (41) through (49).

(52) A circuit-substrate working system comprising:

an upstream circuit-substrate working machine comprising: a multi-lane conveyor device comprising a plurality of conveyor lanes each for conveying a circuit substrate from an upstream side toward a downstream side; and a working device configured to perform a circuit substrate operation on the circuit substrate loaded and unloaded by the multi-lane conveyor device;

a downstream circuit-substrate working machine comprising: the multi-lane conveyor device and the working device and provided downstream of the upstream circuit-substrate working machine; and a shuttle conveyor provided between the upstream circuit-substrate working machine and the downstream circuit-substrate working machine and comprising a movable conveyor lane and a shifting device configured to shift the movable conveyor lane selectively to one of a plurality of positions respectively continuous to the plurality of conveyor lanes of the multi-lane conveyor device of the upstream circuit-substrate working machine and the plurality of conveyor lanes of the multi-lane conveyor device of the downstream circuit-substrate working machine, wherein the circuit-substrate working system further comprises:

an advance-shift control unit configured, when deliverable-state advance notification information is obtained from one of the plurality of conveyor lanes of the upstream circuit-substrate working machine before the one of the plurality of conveyor lanes becomes a state in which a circuit substrate is deliverable, to shift the movable conveyor lane to a position continuous to the one of the plurality of conveyor lanes, the deliverable-state advance notification information being a notification which notifies in advance that the one of the plurality of conveyor lanes is to become the state in which the circuit substrate is deliverable; and a receipt control unit configured, when a circuit substrate is present on the one of the plurality of conveyor lanes of the upstream circuit-substrate working machine, and receivable-state advance notification information is obtained before one of the plurality of conveyor lanes of the downstream circuit-substrate working machine becomes a state in which the circuit substrate is receivable, to have the movable conveyor lane receive the circuit substrate from the one of the plurality of conveyor lanes of the upstream circuit-substrate working machine, the receivable-state advance notification information being a notification which notifies in advance that the downstream circuit-substrate working machine is to become the state in which the circuit substrate is receivable.

(53) A shuttle conveyor provided between an upstream device comprising a multi-lane conveyor device comprising a plurality of conveyor lanes each for conveying a circuit substrate from an upstream side toward a downstream side and a downstream device comprising a multi-lime conveyor device comprising a plurality of conveyor lanes each for conveying a circuit substrate from the upstream side toward the downstream side, the shuttle conveyor comprising: a movable conveyor lane; and a shifting device configured to selectively shift the movable conveyer lane to one of a plurality of positions respectively continuous to the plurality of conveyor lanes of the multi-lane conveyor device of the upstream device and the plurality of conveyor lanes of the multi-lane conveyor device of the downstream device, wherein the shuttle conveyor comprises at least one of:

an advance-shift control unit configured, when deliverable-state advance notification information is obtained from one of the plurality of conveyor lanes of the upstream device, to shift the movable conveyor lane to a position continuous to the one of the plurality of conveyor lanes, the deliverable-state advance notification information being a notification which notifies in advance that the one of the plurality of conveyor lanes is to become a state in which the circuit substrate is deliverable; and a receipt control unit configured, when a circuit substrate is present on one of the plurality of conveyor lanes of the upstream device, and receivable-state advance notification information is obtained from one of the plurality of conveyor lanes of the downstream device, to have the movable conveyor lane receive the circuit substrate from the one of the plurality of conveyor lanes of the upstream device, the receivable-state advance notification information being a notification which notifies in advance that the one of the plurality of conveyor lanes of the upstream device is to become a state in which the circuit substrate is receivable.

(54) A shuttle conveyor provided downstream of an upstream device comprising a multilane conveyor device comprising a plurality of conveyor lanes each for conveying a circuit substrate from an upstream side toward a downstream side, the shuttle conveyor comprising: a movable conveyor lane; and a shifting device configured to shift the movable conveyor lane selectively to one of at least two positions respectively continuous to at least two of the plurality of conveyor lanes of the multi-lane conveyor device, wherein the shuttle conveyor further comprises an advance-shift control unit configured, when deliverable-state advance notification information is obtained from one of the plurality of conveyor lanes of the upstream device, to shift the movable conveyor lane to a position continuous to the one of the plurality of conveyor lanes, the deliverable-state advance notification information being a notification which notifies in advance that the one of the plurality of conveyor lanes is to become a state in which the circuit substrate is deliverable.

EMBODIMENTS

Hereinafter, there will be described embodiments of the claimable invention by reference to the drawings. It is to be understood that the claimable invention is not limited to the embodiments described below, and may be otherwise embodied with various changes and modifications, such as those described in the foregoing "FORMS OF THE INVENTION", which may occur to those skilled in the art.

Figure 1:
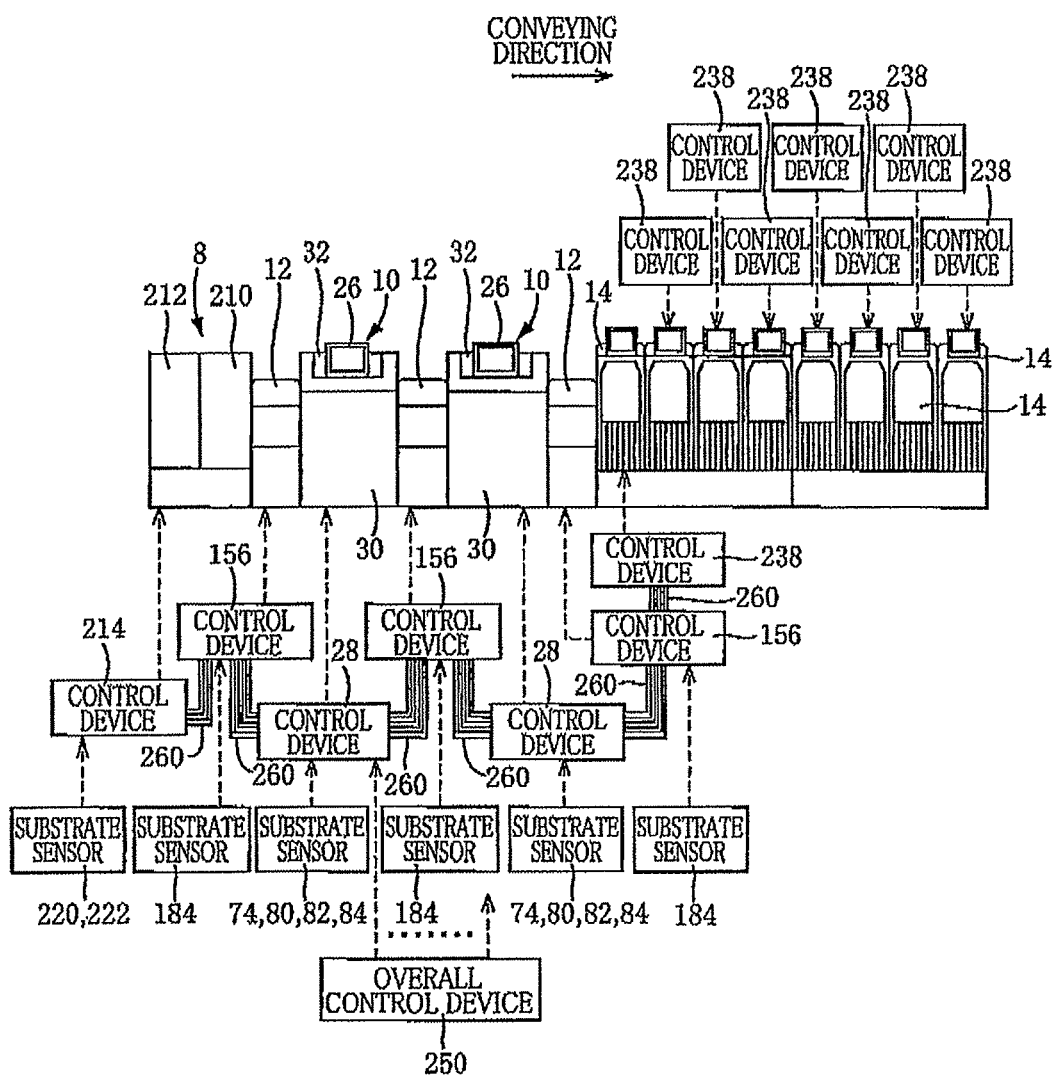
FIG. 1 is a front elevational view illustrating an electronic-circuit assembling system according to one embodiment of the claimable invention.

FIG. 1 illustrates an electronic-circuit assembling system in the form of a circuit-substrate working system according to one embodiment of the claimable invention. The present electronic-circuit assembling system includes: a circuit-substrate supplying machine 8; at least one screen printer 10 (hereinafter simply referred to as "printer 10"), in the present embodiment, a plurality of printers 10, for example two printers in the illustrated example; at least one shuttle conveyor 12, in the present embodiment, a plurality of shuttle conveyors 12, for example, three shuttle conveyors 12 in the illustrated example; and at least one electronic-circuit-component mounting machine 14 (hereinafter simply referred to as "mounting machine 14"), in the present embodiment, a plurality of mounting machines 14, for example, eight mounting machines 14 in the illustrated example. Each of the circuit-substrate supplying machine 8, the printers 10, the shuttle conveyors 12, and the mounting machines 14 is a constituent device of the electronic-circuit assembling system and accordingly may be referred to as "system's constituent device". Also, each of the printers 10 and the mounting machines 14 is one kind of a circuit-substrate working machine.

As illustrated in FIG. 1, the above-described devices such as the circuit-substrate supplying machine 8 are arranged in a row in a conveying direction in which a circuit substrate is conveyed in the present electronic-circuit assembling system, and the three shuttle conveyors 12 are respectively arranged between the circuit-substrate supplying machine 8 and the printers 10, between the two printers 10, and between the printers 10 and the most upstream, one of the mounting machines 14. The three shuttle conveyors 12 may be referred to as "upstream shuttle conveyor 12", "intermediate shuttle conveyor 12", and "downstream shuttle conveyor 12" in order from the upstream side in the conveying direction, and the two printers 10 may be referred to as "upstream printer 10" and "downstream printer 10" in order from the upstream side. A direction perpendicular to the conveying direction on a plane parallel to a work surface of the circuit substrate conveyed in the present system, in the present embodiment, a horizontal plane is determined as a front and rear direction.

The two printers 10 are similar in structure to each other, and the three shuttle conveyors 12 are similar in structure to one another. Thus, the upstream printer 10 and the intermediate shuttle conveyor 12 will be explained by way of example.

Figure 2:
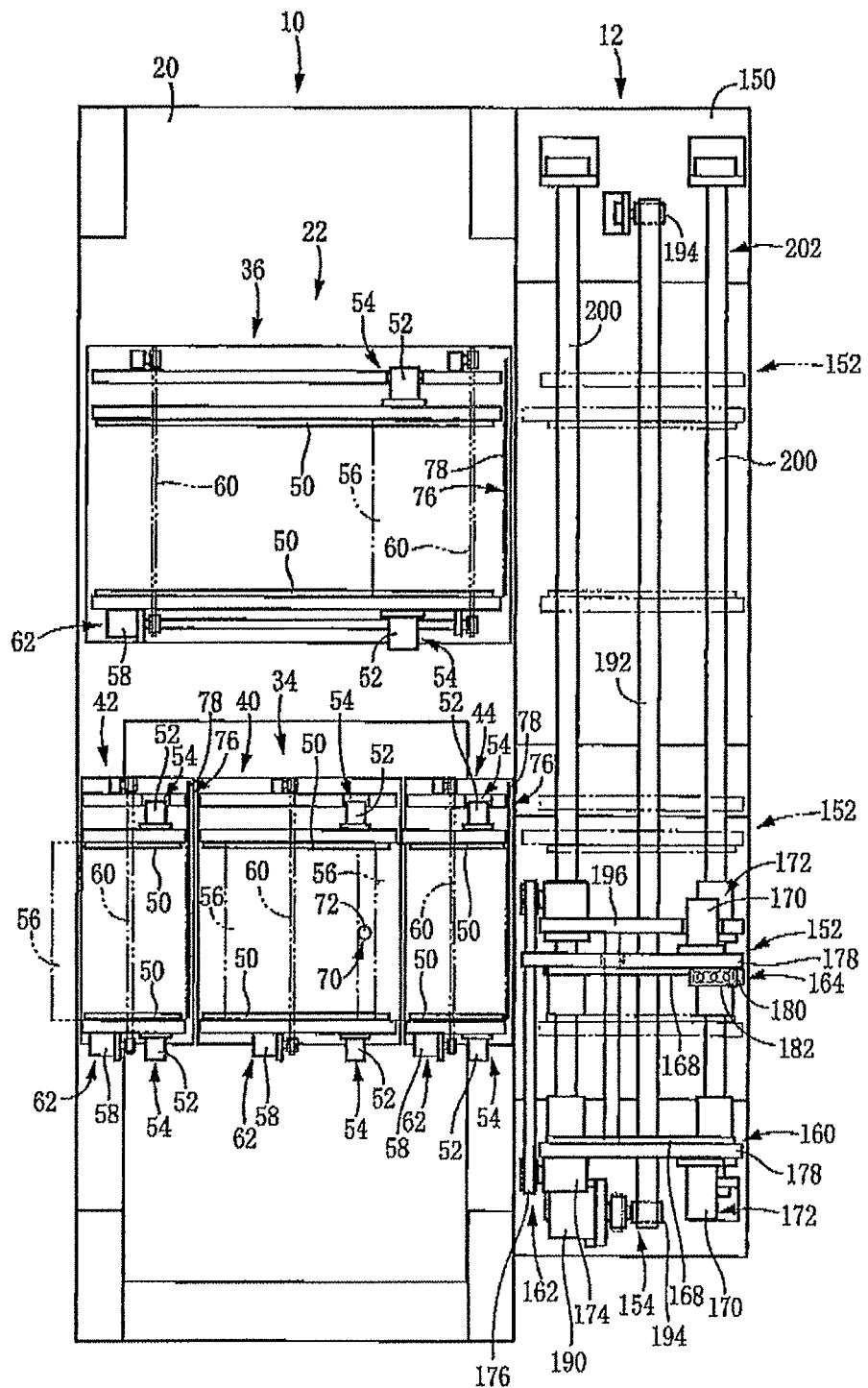
FIG. 2 is a plan view illustrating a printer and a shuttle conveyor of the above-described electronic-circuit assembling system.

As illustrated in FIGS. 1 and 2, the present printer 10 includes: a printer main body 20; a substrate conveyor device 22; a printing device 24 (see FIG. 3) as a working device; an operating device 26; and a control device 28. The devices and components provided in the printer main body 20 are covered with a housing 30. An openable cover 32 is provided on one side of the housing 30 in the front and rear direction, and an operator opens the cover 32 to perform operations for the devices in the housing 30. In the present printer 10, the operating device 26 is provided on the housing 30 at a side on which the cover 32 is provided, and the operator normally operates the printer 10 from the side on which the cover 32 and the operating device 26 are provided. In the present embodiment, the side of the printer 10 on which the operator normally operates the printer 10 is defined as a front side.

As illustrated in FIG. 2, the substrate conveyor device 22 includes at least one conveyor lane, in the present embodiment, a plurality of conveyor lanes, for example, two conveyor lanes 34, 36 in the illustrated example, that is, the substrate conveyor device 22 is a multi-lane conveyor device.

The conveyor lanes 34, 36 are provided next to each other in the front and rear direction and parallel to each other. The conveyor lane 34 provided in a front portion of the printer main body 20 includes: a main conveyor 40; an in-conveyor 42 provided upstream of the main conveyor 40 in the conveying direction; and an outconveyor 44 provided downstream of the main conveyor 40 in the conveying direction. In the present embodiment, each of the conveyors 40, 42, 44 is constituted by a belt conveyor and includes: a pair of conveyor belts 50 and belt rotating devices 54 designed to respectively rotate the pair of conveyor belts 50 by powers of respective belt rotation motors 52 as drive sources. Each of the conveyors 40, 42, 44 conveys a circuit substrate 56 with its printing surface being horizontal. To suit the width of the circuit substrate 56 to be conveyed, a conveyor width that is a distance between the pair of conveyor belts 50 is changed by a width change device 62 including a width change motor 58 and a belt 60.

In the main conveyor 40, the circuit substrate 56 being conveyed is stopped by a stopper device 70. In the present embodiment, the stopper device 70 includes a stopper member 72, an elevating and lowering device, and a moving device, not shown, designed to move the stopper member 72 and the elevating and lowering device to any position on the horizontal plane. In the present embodiment, the stopper member 72 and the elevating and lowering device are moved by the moving device on an area on which the main conveyor 40 is provided. Also, the stopper member 72 and the elevating and lowering device are moved through a portion of the conveyor lane 36 which is adjacent to the main conveyor 40, to a position spaced apart from the conveyor lane 36 and the main conveyor 40, so as not to interfere with contact of the circuit substrate 56 with a mask which will be described below. The elevating and lowering device elevates or lowers the stopper member 72 to one of a non-working position or a retracted position at which the stopper member 72 allows passage of the circuit substrate 56 and a working position at which the stopper member 72 contacts the circuit substrate 56 to stop its movement.

In the present embodiment, the moving device also acts as a moving device for moving an imaging device designed to take images of fiducial marks respectively on the circuit substrate 56 and the mask, so that the stopper device 70 is moved with the imaging device. Also, a substrate sensor 74 (see FIG. 1) as a substrate detection device is provided together with the imaging device to detect the circuit substrate 56 loaded onto the main conveyor 40. In the present embodiment, the substrate sensor 74 is a reflective sensor that is a photoelectric sensor as one kind of a noncontact sensor and outputs a signal that differs according to whether the substrate sensor 74 is detecting the circuit substrate 56 or not.

The circuit substrate 56 conveyed by each of the in-conveyor 42 and the outconveyor 44 is stopped by a corresponding one of stopper devices 76 illustrated in FIG. 2. As described in the specification of the Japanese Patent Application 2010-110426 which has been filed by the present applicant and has not been published yet, the present stopper device 76 includes an elongated plate member in the form of a stopper member 78 that is provided at a position adjacent to and downstream of a corresponding one of the in-conveyor 42 and the outconveyor 44 in the conveying direction, in an orientation in which a longitudinal direction of the stopper device 74 is parallel to a conveyor-width direction and its plate face is perpendicular to the conveying direction. The stopper member 78 is selectively moved to one of a retracted position and a working position by a stopper-member elevating and lowering device, not shown.

In the present printer 10, the circuit substrate 56 is conveyed with its longitudinal direction being parallel to the conveyor-width direction. The dimension of each of the in-conveyor 42 and the outconveyor 44 is shorter in the conveying direction than the largest one of dimensions of circuit substrate of various kinds which are available in printing of solder. Thus, as in the circuit substrate 56 indicated by a two-dot chain line in FIG. 2, an upstream end portion, in the conveying direction, of the circuit substrate may project from each of the conveyors 42, 44 to an upstream side thereof in the conveying direction in a state in which the movement of the circuit substrate is stopped by the stopper device 76. When an amount of the projection of the circuit substrate is a certain amount, it may be impossible to operate a device that is provided upstream of the conveyor 42 or 44, in the present embodiment, the device is the shuttle conveyor 12 for the in-conveyor 42, or the main conveyor 40 for the outconveyor 44. In such a case, the operation of the upstream device is inhibited until the circuit substrate 56 is unloaded from the conveyor 42 or 44.

Also, each of the in-conveyor 42 and the outconveyor 44 is equipped at its downstream end with substrate sensors 80, 82 (see FIG. 1) for detecting the circuit substrate 56.

As illustrated in FIG. 2, the conveyor lane 36 is provided in a rear portion of the printer main body 20 and has the length extending from one to the other end of the printer 10 in the conveying direction. Like the in-conveyor 42, for example, the conveyor lane 36 includes a belt conveyor and a stopper device that can change a conveyor width. It is noted that the same reference numerals will be used for functionally corresponding elements to identify their correspondences, and an explanation thereof is omitted. Also, a substrate sensor 84 is also provided on the conveyor lane 36 at its downstream end.

Figure 3:
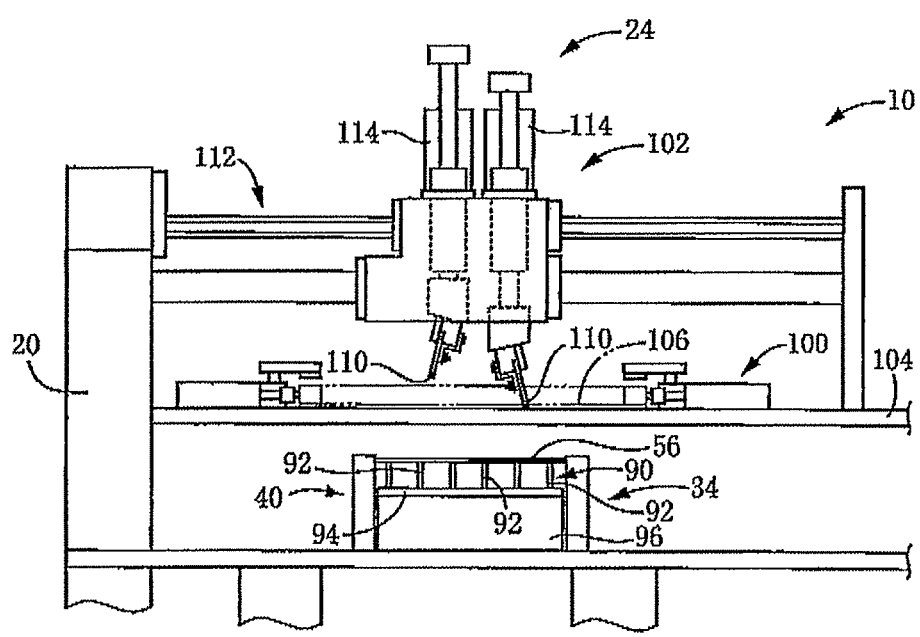
FIG. 3 is a side view generally illustrating a part of the above-described printer.

As schematically illustrated in FIG. 3, the printing device 24 and a substrate support device 90 are provided in the printer main body 20 at an area in which the main conveyor 40 is provided. In the present embodiment, solder is printed on the circuit substrate 56 at the frontmost conveyor lane 34. Hereinafter, the conveyor lane 34 may be referred to as "printing lane 34" as a working lane. The substrate support device 90 includes: a plurality of support pins 92 each as a support member; a pin support table 94; and a support-table elevating and lowering device 96 and supports the circuit substrate 56 from its lower side. In the present embodiment, the substrate support device 90 and the main conveyor 40 cooperate to constitute a substrate clamping device, whereby when the main conveyor 40 is elevated and lowered by an elevating and lowering device, not shown, the circuit substrate 56 is brought into contact with and moved off a lower face of the mask of the printing device 24 which will be described below.

The printing device 24 includes a mask holding device 100 and a squeegee device 102. As illustrated in FIG. 3, the present mask holding device 100 is provided on an upper side of the main conveyor 40 in the printer main body 20 and holds a mask 106 placed on a mask support table 104, with the mask 106 being horizontal. The mask 106 has a plurality of through holes, not shown, formed at positions respectively corresponding to positions at which solder cream (hereinafter simply referred to as "solder") as a printing material is applied to the circuit substrate 56. The squeegee device 102 includes: a pair of squeegees 110; a squeegee moving device 112 designed to move the squeegees 110 along the mask 106 in the front and rear direction; and a squeegee elevating and lowering device 114 designed to elevate and lower the squeegees 110 such that the squeegees 110 are brought into contact with or moved off the mask 106. The squeegee device 102 is provided on an upper side of the mask holding device 100 in the printer main body 20.

The printing device 24 is not provided on the conveyor lane N. Thus, when conveyed by the conveyor lane 36, the circuit substrate 56 passes through the printer 10 without printing thereon. Hereinafter, the conveyor lane 36 will be referred to as "passage lone 36".

As illustrated in FIG. 2, the shuttle conveyor 12 includes a conveyor main body 150, a movable conveyor lane 152, a shifting device 154, and a control device 156 (see FIG. 1). The present movable conveyor lane 152 includes a movable conveyor 160, a width change device 162, and a stopper device 164. The present movable conveyor 160 is a belt conveyor that includes a pair of conveyor belts 168 and a belt rotating device 172 designed to respectively rotate the pair of conveyor belts 168 by powers of respective belt rotation motors 170 as drive sources. The width change device 162 includes a width change motor 174 and a belt 176. The stopper device 164 is provided on a downstream end portion of a movable side frame 178 that is one of a pair of side frames 178 of the movable conveyor 160 which is moved with respect to the other of the pair of side frames 178 during change in width. In the stopper device 164, a stopper member 180 is moved upward and downward by a stopper-member elevating and lowering device 182 so as to be selectively moved to one of a working position and a non-working position or a retracted position. A substrate sensor 184 (see FIG. 1) is provided on the movable conveyor lane 152 at its downstream end portion.

The shifting device 154 includes: a shifting motor 190 as a drive source; a belt 192; and a plurality of pulleys 194. The belt 192 is a timing belt, and each of the pulleys 194 is a timing pulley. When one of the plurality of pulleys 194 is rotated by the shifting motor 190, the belt 192 is moved to move the other of the side frames 178 which is connected to the belt 192 (namely, a fixed side frame 178 that is not moved during the width change) and a support frame 196 for supporting the belt 176. During this movement, the movable side frame 178 is also moved via the width change device 162, BO that the entire movable conveyor lane 152 is movable to any position in the front and rear direction as indicated by one-dot chain lines, two-dot chain lines, and solid lines in FIG. 2. The movable conveyor lane 152 being moved is guided by a guiding device 202 that includes a pair of guide rods 200 each extending in the front and rear direction.

It is noted that the shifting device may be a device that includes a motor and a feed screw mechanism including a feed screw and a nut.

As schematically illustrated in FIG. 1, the circuit-substrata supplying machine 8 includes; a circuit-substrate loading device 210; a substrate container 212; a substrate pull-out device and a substrate transfer device, not shown; and a control device 214. The circuit-substrate loading device 210 includes a plurality of conveyor lanes, in the present embodiment, a first conveyor lane 216 and a second conveyor lane 218 (see FIG. 4). The conveyor lanes 216, 218 are arranged next to each other in the front and rear direction and parallel to each other. Each of the conveyor lanes 216, 218 includes a belt conveyor, a width change device, and a stopper device, and the circuit substrate 56 is detected by substrate sensors 220, 222. The substrate container 212 includes substrate storages (stockers), not shown, respectively for the conveyor lanes 216, 218. A plurality of the circuit substrates 56 stored in each of the substrate storages are supplied one by one by the substrate pull-out device to a corresponding one of the conveyor lanes 216, 218. Hereafter, the conveyor lanes 216, 218 will be referred to as "supply lanes 216, 218". In the present embodiment, positions of the respective supply lanes 216, 218 differ from those of the respective lanes 34, 36 of the printer 10 in the front and rear direction.

Figure 4:
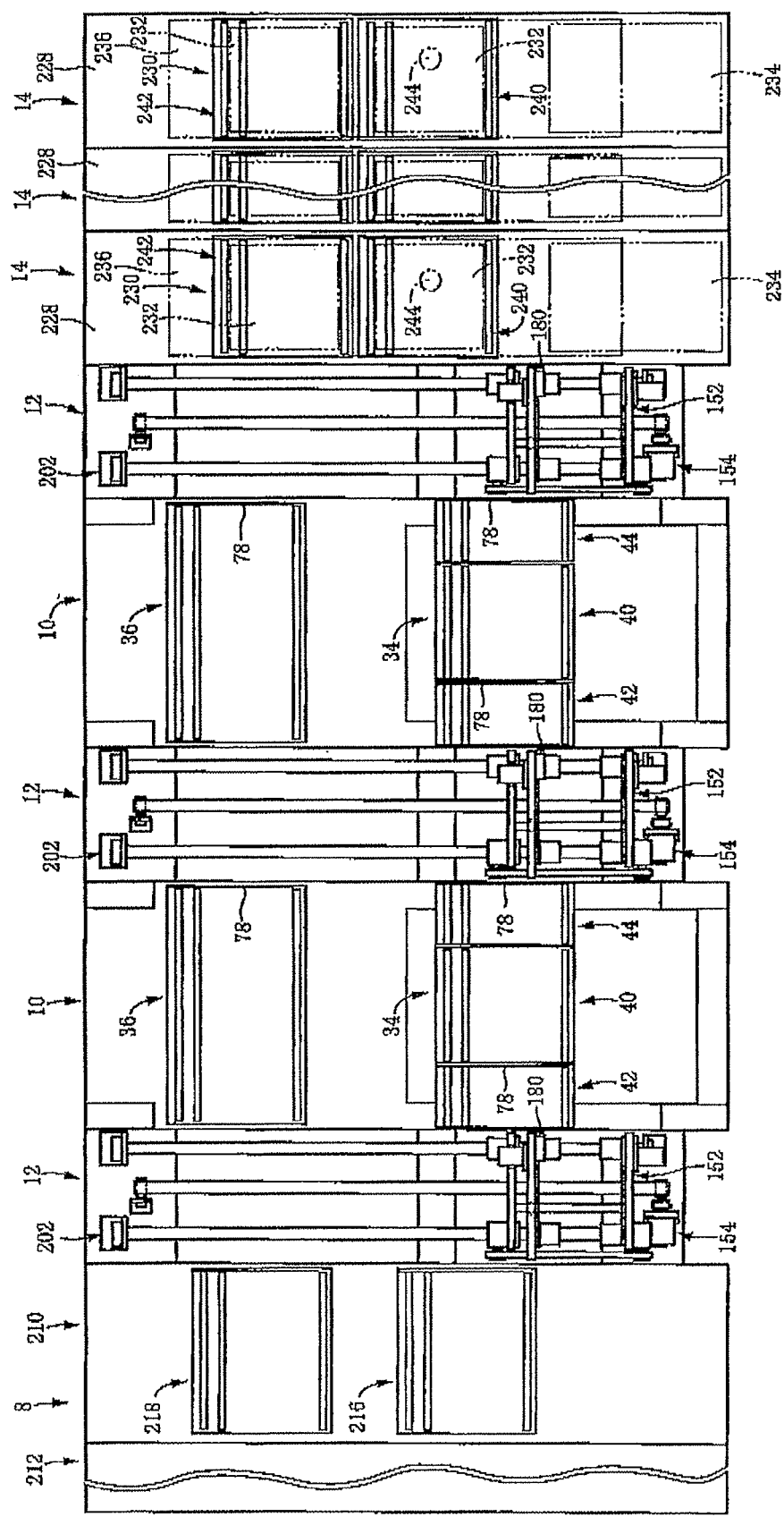
FIG. 4 is a plan view generally illustrating the above-described electronic-circuit assembling system.

In the present embodiment, each of the eight mounting machines 14 is similar in structure to each electronic-circuit-component mounting machine disclosed in JP-A-2004-104075 and is designed in modules. As schematically illustrated in FIG. 4, each of the mounting machines 14 includes a mounting-machine main body 228, a substrate conveyor device 230, substrate support devices 232, a component supplying device 234, and a component mounting device 236 and a control device 238 (see FIG. 1) each as a working device. The eight mounting machines 14 cooperate to mount electronic circuit components onto a single circuit substrate 56 in parallel.

The substrate conveyor device 230 includes a plurality of conveyor lanes, in the present embodiment, a first conveyor lane 240 and a second conveyor lane 242, for example. The conveyor lanes 240, 242 are arranged next to each other in the front and rear direction and parallel to each other in the mounting-machine main body 228. In the present embodiment, each of the conveyor lanes 240, 242 includes a belt conveyor, a width change device, and a stopper device. The substrate support devices 232 are provided for the respective mounting lanes 240, 242. Thus, the circuit substrate 56 conveyed by any of the conveyor lanes 240, 242 is supported by the substrate support device 232, and electronic circuit components are mounted on the circuit substrate 56 by the component mounting device 236. The conveyor lanes 240, 242 may be referred to as "mounting lanes 240, 242". The component mounting device 236 includes: a mounting head 244; and a head moving device, not shown, designed to move the mounting head 244 to any position on the horizontal plane within an area including the lanes 240, 242 and a component supply portion of the component supplying device 234.

Each of the control devices 28, 156, 214, 238 of the plurality of system's constituent devices is mainly constituted by a computer and, controls, for example, drive sources for various devices of the system's constituent devices. Many of motors as the drive sources are each constituted by a servomotor with an encoder, as one kind of an electric rotary motor. These devices such as the control device 28 are controlled in a coordinated manner by an overall control device 250 (see FIG. 1) that controls the overall electronic-circuit assembling system. The overall control device 250 is mainly constituted by a computer.

The computers of the control devices of each adjacent two of the system's constituent devices (the most upstream mounting machine 14 in the case of the mounting machines 14) are connected to each other by corresponding signal lines 260. The signal lines 260 are constituted by at least one signal line, in the present embodiment, a plurality of signal lines, and four signal lines 260 are provided between the circuit-substrate supplying machine 8 and the upstream shuttle conveyor 12 while six signal lines 260 are provided between each adjacent two of the system's constituent devices other than between the circuit-substrate supplying machine 8 and the upstream shuttle conveyor 12.

In the electronic-circuit assembling system as constructed above, the solder is printed on the circuit substrate 56 by one of the two printers 10, and the electronic circuit components are mounted on the circuit substrate 56 by the eight mounting machines 14. Since the printing is carried out on the front conveyor lanes 34 in both of the two printers 10, the circuit substrate 56 is delivered and received between the two printers 10 by the corresponding shuttle conveyor 12 so as to be transferred between conveyor lanes whose positions differ from each other in the front and rear direction, so that the solder is printed on the circuit substrate 56 on the printing lane 34 of one of the printers 10 while the circuit substrate 56 is conveyed through the passage lane 36 of the other of the printers 10.

In the present embodiment, for each of the supply lanes 216, 218, it is determined in advance which of the upstream and downstream printers 10 is used to print the solder on the circuit substrate 56 supplied from the supply lane of the circuit-substrate supplying machine 8. Also, for each of the lanes 34, 36, it is determined in advance which of the mounting lanes 240, 242 of the most upstream mounting machine 14 receives the circuit substrate 56 conveyed by the lane of the downstream printer 10, and as indicated by the solid line arrow and the broken line arrow in FIG. 5, there are two conveyance paths for the circuit substrate 56, In the two printers 10, the same mask can be mounted for the same kind of printing on the circuit substrate 56, and different masks can be respectively mounted for different kinds of printing, e.g., printing of the solder on a front face of the circuit substrate 56 and printing of the solder on a back face of the circuit substrate 56. The substrate storages respectively corresponding to the supply lanes 216, 218 store the circuit substrates 56 to be supplied from the respective supply lanes 216, 218. The circuit substrates 56 may be supplied to the printing lanes 34 of the respective two printers 10 alternately to carry out the printing alternately, or alternatively the printing may be successively carried out by one of the printers 10. The order of the printing of the two printers 10 is determined in advance, and the circuit substrate 56 is supplied from the two supply lanes 216, 218 to the upstream shuttle conveyor 12 in that order.

The movable conveyor lane 152 of the upstream shuttle conveyor 12 (hereinafter may be referred to as "upstream movable conveyor lane 152") is selectively moved to one of positions that are respectively the same in the front and rear direction as and continuous to the supply lanes 216, 218, the printing lane 34, and the passage lane 36, namely a first-supply-lane corresponding position, a second-supply-lane corresponding position, a printing-lane corresponding position, and a passage-lane corresponding position.

The movable conveyor lane 152 of the intermediate shuttle conveyor 12 (hereinafter may be referred to as "intermediate movable conveyor lane 152") is selectively moved to one of positions respectively corresponding to and continuous to the lanes 34, 36 of each of the upstream and downstream printers 10, namely a printing-lane corresponding position and a passage-lane corresponding position. The movable conveyor lane 152 of the downstream shuttle conveyor 12 (hereinafter may be referred to as "downstream movable conveyor lane 152") is selectively moved to one of positions respectively corresponding to and continuous to the printing lane 34, the passage lane 36, and the mounting lanes 240, 242, namely a printing-lane corresponding position, a passage-lane corresponding position, a first-mounting-lane corresponding position, and a second-mounting-lane corresponding position. A position at which each movable conveyor lane 152 receives the circuit substrate 56 is a circuit-substrate receiving position, and a position at which each movable conveyor lane 152 delivers the circuit substrate 56 is a circuit-substrate delivery position.

There will be briefly explained one example of conveyance, printing of solder, and mounting of electronic circuit components for the circuit substrate 56 on which the solder is printed by the downstream printer 10.

Figure 5:
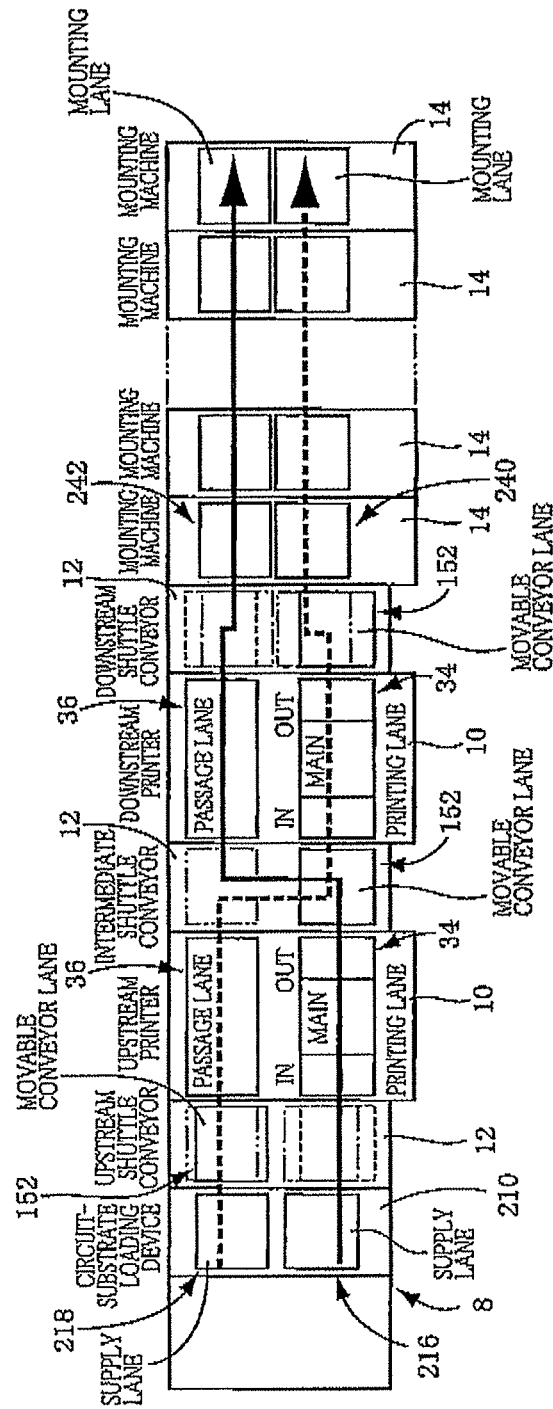
FIG. 5 is a view explaining circuit-substrate conveyance paths in the above-described electronic-circuit assembling system.

As indicated by the broken line arrow in FIG. 5, the circuit substrate 56 is supplied from the rear supply lane 218 and loaded onto the upstream movable conveyor lane 152 located at the second-supply-lane corresponding position. Upon receipt of the circuit substrate 56, the upstream movable conveyor lane 152 is moved to the passage-lane corresponding position by the shifting device 154 to convey the circuit substrate 56 onto the passage lane 36. On the passage lane 36, the circuit substrate 56 waits for its loading on the intermediate movable conveyor lane 152.

After the loading of the circuit substrate 56, the intermediate movable conveyor lane 152 is moved to the printing-lane corresponding position. The circuit substrate 56 is loaded from the intermediate movable conveyor lane 152 onto the in-conveyor 42 and waits for its loading onto the main conveyor 40. In this waiting, an upstream end portion of the circuit substrate 56 projects from the in-conveyor 42 toward the intermediate shuttle conveyor 12, so that the intermediate movable conveyor lane 152 is not movable and temporarily stopped.

When the loading onto the main conveyor 40 is enabled, the circuit substrate 56 is loaded from the in-conveyor 42 onto the main conveyor 40, on which the circuit substrate 56 is supported by the substrate support device 90 and clamped by the substrate clamping device. The main conveyor 40 is then moved upward by the elevating and lowering device to hold the circuit substrate 56 in contact with a mask 126, and in this state a squeegee 130 is moved to print the solder on the circuit substrate 56. After the printing, the main conveyor 40 is moved downward to lower and unclamp the circuit substrate 56 that is then unloaded from the main conveyor 40 and delivered onto the outconveyor 44, on which the circuit substrate 56 waits for its loading onto the downstream movable conveyor lane 152. In this waiting, the upstream end portion of the circuit substrate 56 projects from the outconveyor 44 toward the main conveyor 40, so that the main conveyor 40 is temporarily stopped. The next circuit substrate 56 cannot be loaded from the in-conveyor 42 onto the main conveyor 40 in this state. Thus, the next circuit substrate 56 waits on the in-conveyor 42.

The downstream movable conveyor lane 152 receives the printed substrate 56 at the printing-lane corresponding position. After receiving, the downstream movable conveyor lone 152 is moved to the first-mounting-lane corresponding position to convey the printed substrate 56 onto the front mounting lane 240. This circuit substrate 56 is then conveyed by the front mounting lanes 240 of the eight mounting machines 14, and the electronic circuit components are mounted on the circuit substrate 56 by the component mounting device 236. The loading of the circuit substrate 56 onto each lane 152, 36, 34 (the in-conveyor 42 and the outconveyor 44) is stopped by each of the stopper members 180, 78 located at the working position. In unloading of the circuit substrate 56, a corresponding one of the stopper members 180, 78 is lowered to the retracted position.

Among these deliveries and receipts of the circuit substrate 56 in the present electronic-circuit assembling system, the delivery and receipt of the circuit substrate 56 between each adjacent two of the circuit-substrate supplying machine 8, the two printers 10, the most upstream mounting machine 14, and the three shuttle conveyors 12 are performed by control of the control devices 28, 156, 214, 238 for the devices and components such as the conveyors of the conveyor lanes and control of the control device 156 for the devices and components such as the shifting device 154 on the basis of transmission and receipt of information using the signal lines 260 between the adjacent two of the system's constituent devices.

Figure 6:
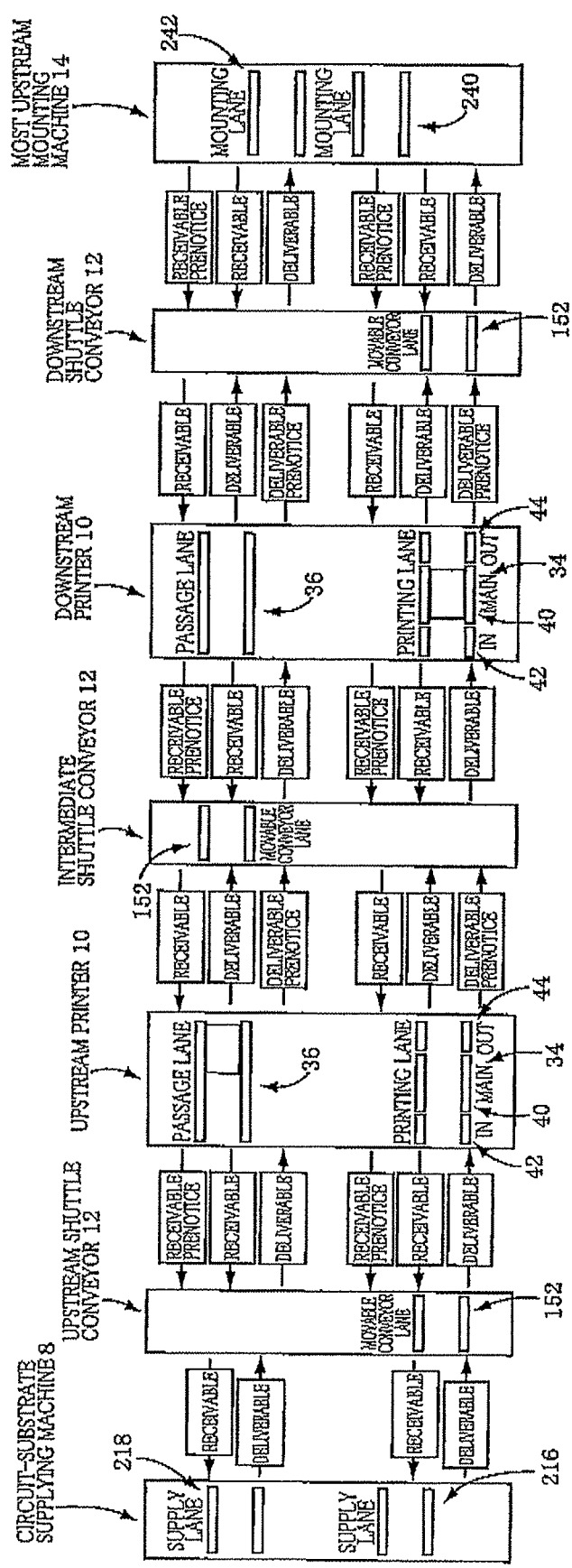
FIG. 6 is a view explaining signals transmitted and received between each adjacent two of system's constituent devices of the above-described electronic-circuit assembling system.

The delivery and receipt of the circuit substrate are performed according to the SMEMA standard. That is, the delivery and receipt are performed in a state in which the deliverable-state information and the receivable-state information are obtained for two lanes by which the delivery and receipt are performed. The deliverable-state information is information that represents that the circuit substrate 56 is present on the lane, and the lane can deliver the circuit substrate 56, while the receivable-state information is information that represents that the circuit substrate 56 is absent on the lane, and the lane can receive the circuit substrate 56. In the present embodiment, as illustrated in FIG. 6, the deliverable-state information is selectively produced for one of the supply lanes 216, 218 of the circuit-substrate supplying machine 8, the movable conveyor lanes 152 of the shuttle conveyors 12, and the printing lanes 34 and the passage lanes 36 of the printers 10, and a signal representative of the information is transmitted to a corresponding downstream system's constituent device. The receivable-state information is selectively produced for one of the movable conveyor lane 152, the printing lane 34, the passage lane 36, and the mounting lanes 240, 242 of the most upstream mounting machine 14, and a signal representative of the information is transmitted to a corresponding upstream system's constituent device. Though not shown, the deliverable-state information is produced for the mounting lanes 240, 242 of the seven mounting machines 14 different from the most downstream mounting machine 14, while the receivable-state information is produced for the mounting lanes 240, 242 of all the mounting machines 14. On the basis of the information, the delivery and receipt of the circuit substrate 56 are performed between adjacent two of the mounting machines 14. The information is transmitted and received by communication using communication lines between the control devices 238 of the eight mounting machines 14. In a case where a system's constituent device such as a substrate container including two conveyor lanes is provided downstream of and adjacent to the most downstream mounting machine 14, the deliverable-state information is produced for the most downstream mounting machine 14 and the receivable-state information is produced for the two conveyor lanes of the substrate container, based on which the delivery and receipt of the circuit substrate 56 are performed.

Furthermore, in the present embodiment, deliverable-state advance notification information is produced for the printing lane 34 and the passage lane 36, and receivable-state advance notification information is produced for the printing lane 34, the passage lane 36, and the mounting lanes 240, 242. The deliverable-state advance notification information is information that notifies in advance that a state in which the circuit substrate 56 is present is established after a lapse of a set specific length of time, and a signal representative of the information is transmitted to a corresponding downstream one of the shuttle conveyors 12. The receivable-state advance notification information is information that notifies in advance that the receipt of the circuit substrate 56 becomes possible after a lapse of a set specific length of time, and a signal representative of the information is transmitted to a corresponding upstream one of the shuttle conveyors 12.

The delivery and receipt are executed on condition that a deliverable-state signal and a receivable-state signal are obtained. An operation performed in the state in which the deliverable-state signal and the receivable-state signal are obtained is a delivery and receipt operation. While the deliverable-state signal can be transmitted when the circuit substrate 56 can be delivered, and the receivable-state signal can be transmitted when the circuit substrate 56 can be received, it is not essential that each signal is transmitted immediately after its transmission is made possible. That is, timings of the transmission can be set according to structures of the machines and devices, for example. Since the movable conveyor lane 152 is shifted in the shuttle conveyor 12, timings of the transmission of the deliverable-state signal and the receivable-state signal are set according to whether the shift operation is included in the delivery and receipt operation or not. In any case, in the present embodiment, the delivery and receipt operation includes the rotations of the conveyor belt and the movement of the stopper member to the retracted position.

In the present embodiment, the deliverable-state signal is transmitted in response to the detection of the circuit substrate 56 by the substrate sensors 220, 222, 82, 84, 184.

It is noted that in a case where the upstream device is a working device, and the conveyor constituting the conveyor lane does not include the outconveyor and delivers the circuit substrate from the working device directly to the shuttle conveyor, the delivery of the circuit substrate is enabled in a state in which operations of the working device are finished. Thus, the deliverable-state signal is transmitted when the circuit substrate is detected by the substrate sensor, and the operations are finished. Without consideration given to the detection of the circuit substrate by the substrate sensor, the deliverable-state information may be produced on the basis of the end of the operations, and the deliverable-state signal may be transmitted.

For the printing lane 34, the deliverable-state advance notification signal is transmitted, on the basis of printing progress, a set length of time before a point in time when it is expected that the circuit substrate 56 is unloaded from the main conveyor 40 and delivered onto the outconveyor 44, and the delivery of the circuit substrate 56 from the outconveyor 44 onto the downstream shuttle conveyor 12 is made possible. For the passage lane 36, the deliverable-state advance notification signal is transmitted on the basis of receipt of the deliverable-state signal transmitted from the upstream shuttle conveyor 12. This is because, when the circuit substrate 56 is present on the upstream shuttle conveyor 12, a state in which the circuit substrate 56 is present on the passage lane 36 is expected to be established within a set length of time by loading of the circuit substrate 56 onto the passage lane 36. The deliverable-state advance notification signal may be transmitted on the basis of start of the loading of the circuit substrate 56 onto the passage lane 36.

The receivable-state signal is transmitted for the in-conveyor 42 of the printing lane 34 on the basis of the printing progress. In the present embodiment, the receivable-state signal is transmitted when the main conveyor 40 is lowered and enabled to deliver the circuit substrate 56 onto the outconveyor 44 after the completion of the printing. For the passage lane 36, the receivable-state signal is transmitted in an empty state in which the circuit substrate 56 is not present on the passage lane 36. For the mounting lanes 240, 242, when the mounting operation of the electronic circuit components on the circuit substrate 56 is finished, and the circuit substrate 56 starts to be delivered onto the mounting machine 14 located downstream of the circuit substrate 56, the receivable-state signal is transmitted for one of the mounting lanes on which the electronic circuit components are to be mounted onto the circuit substrate 56 next. For the shuttle conveyors 12, as will be explained later, the receivable-state signal is transmitted on the basis of: receipt of the receivable-state advance notification signal from a lane that is to receive the circuit substrate 56 from the movable conveyor lane 152; and a state in which the movable conveyor lane 152 is positioned to the circuit-substrate receiving position.

For the printing lane 34 and the mounting lanes 240, 242, the receivable-state advance notification, signal is transmitted a set length of time before a receivable-state-signal producing timing that is set on the basis of the above-described printing progress and mounting progress. For the passage lane 36, the receivable-state advance notification signal is transmitted on the basis of receipt of the receivable-state signal transmitted from the downstream shuttle conveyor 12. This is because, in a case where the downstream shuttle conveyor 12 can receive the circuit substrate 56, the circuit substrate can be unloaded from the passage lane 36 and delivered onto the shuttle conveyor 12, and therefore the passage lane 36 is expected to be empty within a set length of time, which enables the passage lane 36 to receive the circuit substrate 56.

In the present embodiment the set length of time for transmitting the deliverable-state advance notification signal and the set length of time for transmitting the receivable-state advance notification signal are equal to each other, and each time is equal to the sum of a length of time required for the movement of the movable conveyor lane 152 from one to the other of the two front and rear conveyor lanes and a length of time required for transfer of the circuit substrate 56 from an upstream system's constituent device to the movable conveyor lane 152. The set length of time may be determined as a time that is obtained by adding, to the sum, a length of time required for transfer of the circuit substrate 56 from the movable conveyor lane 152 to a downstream system's constituent device.

The signal representative of each information is transmitted upon closing of contacts of the signal line 260 between corresponding adjacent two of the system's constituent devices (that is, when the signal becomes ON), and its transmission is stopped upon opening of the contacts (that is, when the signal becomes OFF). Also, as described above, in the present embodiment, the four or six signal lines 260 are connected between the respective computers of each adjacent two of the system's constituent devices. The number of the provided signal lines 260 is the number obtained by multiplying the number of types of signals transmitted and received in delivery and receipt of the circuit substrate 56 between each adjacent system's constituent devices, by the number of conveyor lanes of a corresponding one of the circuit-substrate supplying machine 8, the printers 10, and the mounting machines 14. The type of information to be transmitted and its assignment to one of the conveyor lanes are determined in advance for each of the signal lines 260. In the present electronic-circuit assembling system, the two conveyance paths of the circuit substrate 56 are set. Thus, according to the signal line 260 through which the signal is transmitted, the computer of the control device of each of the system's constituent devices can recognize which of conveyance paths the signal is for and which of the signal lines 260 the signal is to be transmitted to.

Figure 7:
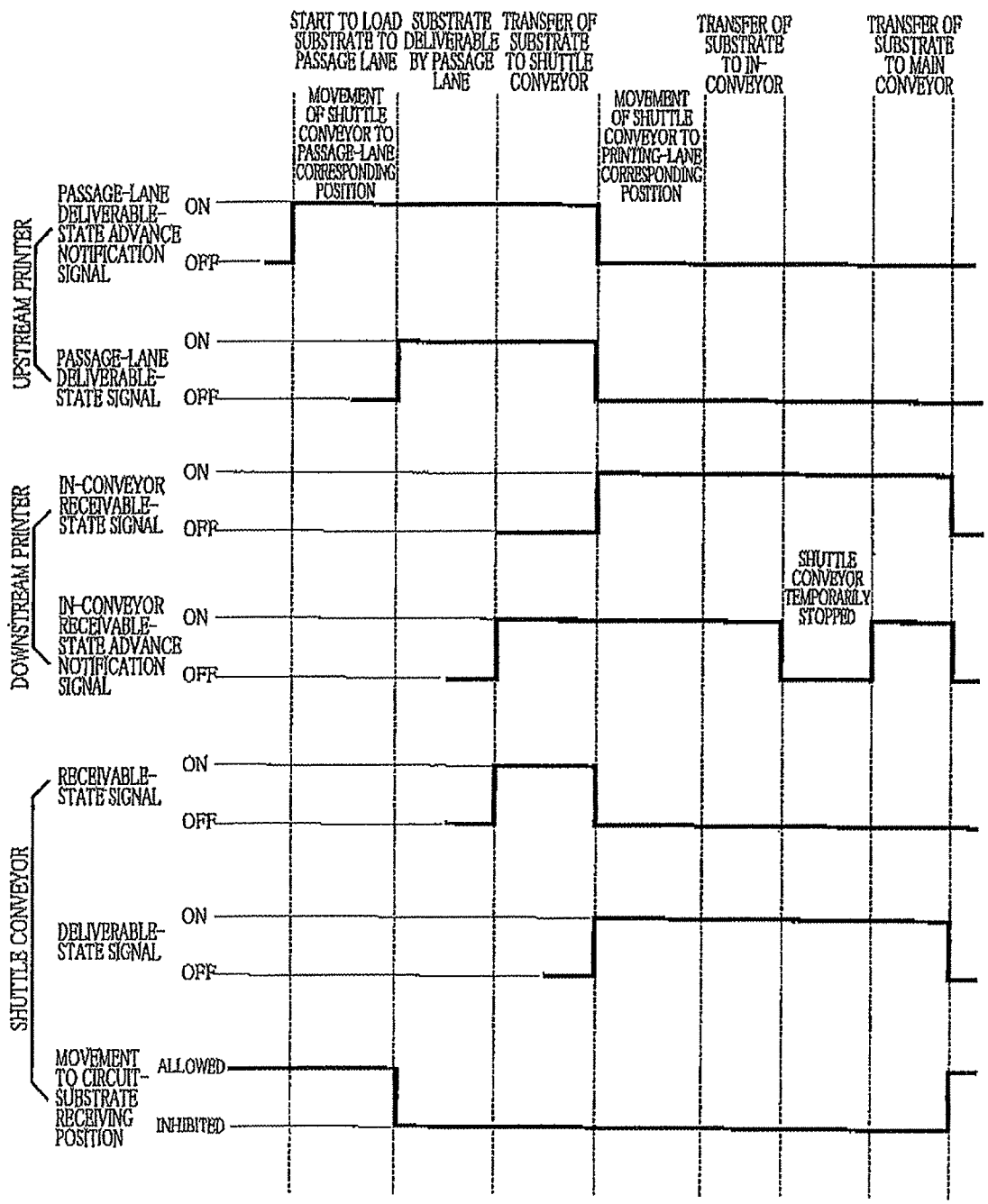
FIG. 7 is a cycle timing diagram for explaining signals transmitted and received between each of an upstream printer and a downstream printer, and an intermediate shuttle conveyor of the above-described electronic-circuit assembling system and for explaining delivery and receipt of a circuit substrate on the basis of the transmission and receipt of the signals therebetween.

There will be specifically explained, with reference to a cycle timing diagram illustrated in FIG. 7, transmission and receipt of information between the intermediate shuttle conveyor 12 and each of the upstream and downstream printers 10 as one example of transmission and receipt of information in the delivery and receipt of the circuit substrate 56 on which solder is to be printed by the downstream printer 10.

It is noted that While FIG. 7 illustrates a situation in which the receivable-state signal for the downstream printer 10 and the deliverable-state signal for the shuttle conveyor 12 become ON at the same time, this situation indicates that the circuit substrate 56 are delivered and received when both of the signal become ON, and timings at which the signals become ON may or may not be the same as each other. This is also applied to FIGS. 8-10.

In the delivery of the circuit substrate 56 from the upstream printer 10 to the intermediate shuttle conveyor 12, when the deliverable-state advance notification signal for the passage lime 36 becomes ON, the intermediate movable conveyor lane 152 is moved to the passage-lane corresponding position. In a case where the intermediate movable conveyor lane 152 has already been located at the passage-lane corresponding position by, e.g., previous delivery of the circuit substrate 56 to the passage lane 36 of the downstream printer 10, the intermediate movable conveyor lane 152 is kept at the passage-lane corresponding position. If there is positional error of the passage lane 36 of each of the upstream and downstream printers 10 in the front and rear direction, the positional error is eliminated by the movement of the intermediate movable conveyor lane 152. As will be explained later, since the movable conveyor lane 152 of the intermediate shuttle conveyor 12 is allowed to be shifted after the circuit substrate 56 received is delivered to the downstream device, the movable conveyor lane 152 is empty when positioned at the passage-lane corresponding position. Also, the movable conveyor lane 152 is shifted to the circuit-substrate delivery position in response to the change of the deliverable-state advance notification signal to ON, that is, the movable conveyor lane 152 starts to be shifted without the deliverable-state signal and the receivable-state signal. Thus, the shift is not included in the delivery and receipt operation.

When the deliverable-state signal for the passage lane 36 becomes ON in the upstream printer 10, and the receivable-state signal for the passage lane 36 becomes ON in the intermediate shuttle conveyor 12, the stopper member 78 is moved to its retracted position, and the belt rotation motors 52, 170 for the passage lane 36 and the movable conveyor lane 152 are driven to transfer the circuit substrate 56. The receivable-state signal becomes ON on condition that the receivable-state advance notification signal for the printing lane 34 becomes ON in the downstream printer 10 and that the movable conveyor lane 152 is located at the passage-lane corresponding position as the circuit-substrate receiving position. Thus, even if the deliverable-state signal becomes ON during the shift of the movable conveyor lane 152 to the circuit-substrate receiving position, the delivery and receipt of the circuit substrate 56 are not started because the receivable-state signal is not ON, making it possible to prevent the belt conveyors and the stopper member 78 of the passage lane 36 from being operated. In the present embodiment, commands for operating the belt conveyors and the stopper member 78 of the passage lane 36 are supplied at the timing when the circuit substrate 56 starts to be moved in the state in which the stopper member 78 is located at the retracted position. A signal for operating the movable conveyor 160 of the movable conveyor lane 152 is supplied at the timing at which the conveyor belts 168 of the movable conveyor 160 start to be rotated when the circuit substrate 56 starts to be moved by the belt conveyors of the passage lane 36 after both of the deliverable-state signal for the passage lane 36 and the receivable-state signal for the intermediate shuttle conveyor 12 become ON. The operation signal may be supplied to the movable conveyor 160 when the deliverable-state signal and the receivable-state signal become ON.

It is noted that while FIG. 7 illustrates a situation in which the receivable-state signal for the shuttle conveyor 12 becomes ON after the deliverable-state signal for the passage lane 36 becomes ON, the present invention is not limited to this situation. The receivable-state signal may become ON before the deliverable-state signal, and the receivable-state signal and the deliverable-state signal may become ON at the same time. This is also applied to FIGS. 8-10 (specifically, the deliverable-state signal for the outconveyor 44 in FIGS. 8 and 10). Also, while FIG. 7 illustrates that the start of the loading of the substrate onto the passage lane 36 is in parallel with the movement of the shuttle conveyor 12 to the passage-lane corresponding position (i.e., the circuit-substrate receiving position), this illustration merely indicates that each of the operations is performed, and timings of the operations may be partly the same as each other and may be different from each other. This is also applied to FIGS. 8.10, and 12 (specifically, the start of the loading of the substrate onto the outconveyor 44 and the movement of the shuttle conveyor 12 to the printing-lane corresponding position in FIGS. 8 and 10).

The completion of the loading of the circuit substrate 56 onto the intermediate shuttle conveyor 12 is recognized by the detection of the circuit substrate 56 by the substrate sensor 184. Upon the completion of the loading, the deliverable-state signal for the intermediate shuttle conveyor 12 becomes ON, and the receivable-state signal for the intermediate shuttle conveyor 12 becomes OFF. Also, since the circuit substrate 56 becomes absent on the passage lane 36 by the transfer of the circuit substrate 56, the deliverable-state signal and the deliverable-state advance notification signal become OFF. The receivable-state advance notification signal is kept at ON.

When the receivable-state signal for the printing lane 34 becomes ON in the downstream printer 10, and the deliverable-state signal and the receivable-state signal are obtained respectively for the intermediate shuttle conveyor 12 and the printing lane 34, the intermediate movable conveyor lane 152 is moved to the printing-lane corresponding position as the circuit-substrate delivery position. In the present embodiment, the shift of the movable conveyor lane 152 to the circuit-substrate delivery position is included in the delivery and receipt operation. After the movement, the circuit substrate 56 is loaded from the intermediate movable conveyor lane 152 onto the in-conveyor 42.

After the intermediate movable conveyor lane 152 is moved to the circuit-substrate delivery position, the stopper member 180 of the intermediate movable conveyor Lane 152 is moved to its retracted position, and the movable conveyor 160 thereof starts to be operated. Signals for operating the stopper member 180 and the movable conveyor 160 are supplied at the timing when the circuit substrate 56 starts to be moved in the state in which the stopper member 180 is located at the retracted position. The in-conveyor 42 starts to be operated a set length of time after both of the receivable-state signal and the deliverable-state signal become ON. The set length of time is determined on the basis of a length of time required for the movement of the intermediate movable conveyor lane 152 from the passage-lane corresponding position to the printing-lane corresponding position and a length of time required for the movement of the stopper member 180 to the retracted position and also determined such that the conveyor belts 50 of the in-conveyor 42 start to be rotated when the circuit substrate 56 starts to be moved by the intermediate movable conveyor lane 152. The set length of time may be determined such that an operating signal is supplied to the in-conveyor 42 upon completion of the shift of the intermediate movable conveyor lane 152.

The loading of the circuit substrate 56 onto the in-conveyor 42 is detected by the substrate sensor 80. Upon completion of the loading, the receivable-state advance notification signal for the printing lane 34 becomes OFF, and the movable conveyor 160 of the intermediate movable conveyor lane 152 is temporarily stopped. The in-conveyor 42 is also stopped. Thereafter, when the printed circuit substrate 56 conveyed onto the outconveyor 44 in the downstream printer 10 is conveyed onto the downstream movable conveyor lane 152, the receivable-state advance notification signal becomes ON, and the intermediate and downstream movable conveyor lanes 152 and the conveyors 40, 42, 44 are operated at the same time, so that the printed substrate 56 is unloaded from the outconveyor 44 and conveyed onto the downstream movable conveyor lane 152, and a circuit substrate 56 before the printing is loaded from the in-conveyor 42 onto the main conveyor 40.

It is noted that it is technically possible to temporarily stop and restart the intermediate movable conveyor lane 152 not based on OFF and ON of the receivable-state advance notification signal as described above but based on OFF and ON of the receivable-state signal, and this configuration is more natural than the above-described configuration. However, the SMEMA standard defines that the receivable-state signal has to be kept at ON until the loading of the circuit substrate onto the downstream printer 10 is finished (in the example illustrated in FIG. 7, until the circuit substrate 56 is transferred to the main conveyor 40). Thus, the present embodiment achieves the object by using the OFF and ON of the receivable-state advance notification signal which have no relationship with the SMEMA standard.

When the loading of the circuit substrate 56 onto the main conveyor 40 is detected by the substrate sensor 74, the receivable-state signal and the receivable-state advance notification signal transmitted by the downstream printer 10 are changed to OFF. As a result, the deliverable-state signal transmitted by the intermediate shuttle conveyor 12 is changed to OFF, and the intermediate movable conveyor lane 152 is allowed to move to the circuit-substrate receiving position. Thus, while the upstream end portion of the circuit substrate 56 projects toward the intermediate shuttle conveyor 12 in a state in which the circuit substrate 56 is loaded from the intermediate shuttle conveyor 12 on the in-conveyor 42, even when the deliverable-state advance notification signal for the outconveyor 44 of the passage lane 36 or the printing lane 34 is changed to ON in this state in the upstream printer 10, it is possible to prevent the shifting device 154 from being operated with the circuit substrate 56 partly located within the movable conveyor lane 152. The movement of the movable conveyor lane 152 to the circuit-substrate receiving position is inhibited in response to the completion of the movement of the movable conveyor lane 152 to the circuit-substrate receiving position.

The deliverable-state advance notification signal is not transmitted from the circuit-substrate supplying machine 8 in delivery and receipt of the circuit substrate 56 by the upstream shuttle conveyor 12 between the circuit-substrate supplying machine 8 and the upstream printer 10. This is because, when the circuit substrate 56 is unloaded, the circuit substrate 56 is immediately supplied from the substrate storages, and thus the circuit substrate 56 is usually present on the supply lanes 216, 218 of the circuit-substrate supplying machine 8. The order of the supply of the circuit substrates 56 by the supply lanes 216, 218 is determined in advance, and the deliverable-state signal becomes ON in that order. The upstream shuttle conveyor 12 is positioned to the circuit-substrate receiving position continuous to one of the supply lanes 216, 218 for which the deliverable-state signal becomes ON. In addition, the receivable-state advance notification signal becomes ON for one of the conveyor lanes 34, 36 of the upstream printer 10 which is to receive the circuit substrate 56. As a result, the receivable-state signal for the upstream shuttle conveyor 12 becomes ON, and the upstream shuttle conveyor 12 receives the circuit substrate 56. Here, the upstream movable conveyor lane 152 receives the circuit substrate 56 from the supply lane 218, and the deliverable-state signal becomes ON. When the deliverable-state signal and the receivable-state signal become ON between the upstream movable conveyor lane 152 and the passage lane 36, the upstream movable conveyor lane 152 is moved to the passage-lane corresponding position to convey the circuit substrate 56 onto the passage lane 36.

As illustrated in FIG. 6, as in the delivery and receipt of the circuit substrate 56 between the two printers 10 by the intermediate shuttle conveyor 12, delivery and receipt of the printed substrate 56 by the downstream shuttle conveyor 12 between the printing lane 34 of the downstream printer 10 and the mounting lane 240 of the most upstream mounting machine 14 are performed on the basis of transmission and receipt of signals including the deliverable-state advance notification signal and the receivable-state advance notification signal. The mounting lane 240 includes a single belt conveyor, and the circuit substrate 56 is loaded onto a mounting position as a working position without temporarily stopped in the middle of the loading as in the loading onto the printing lane 34.

Figure 8:
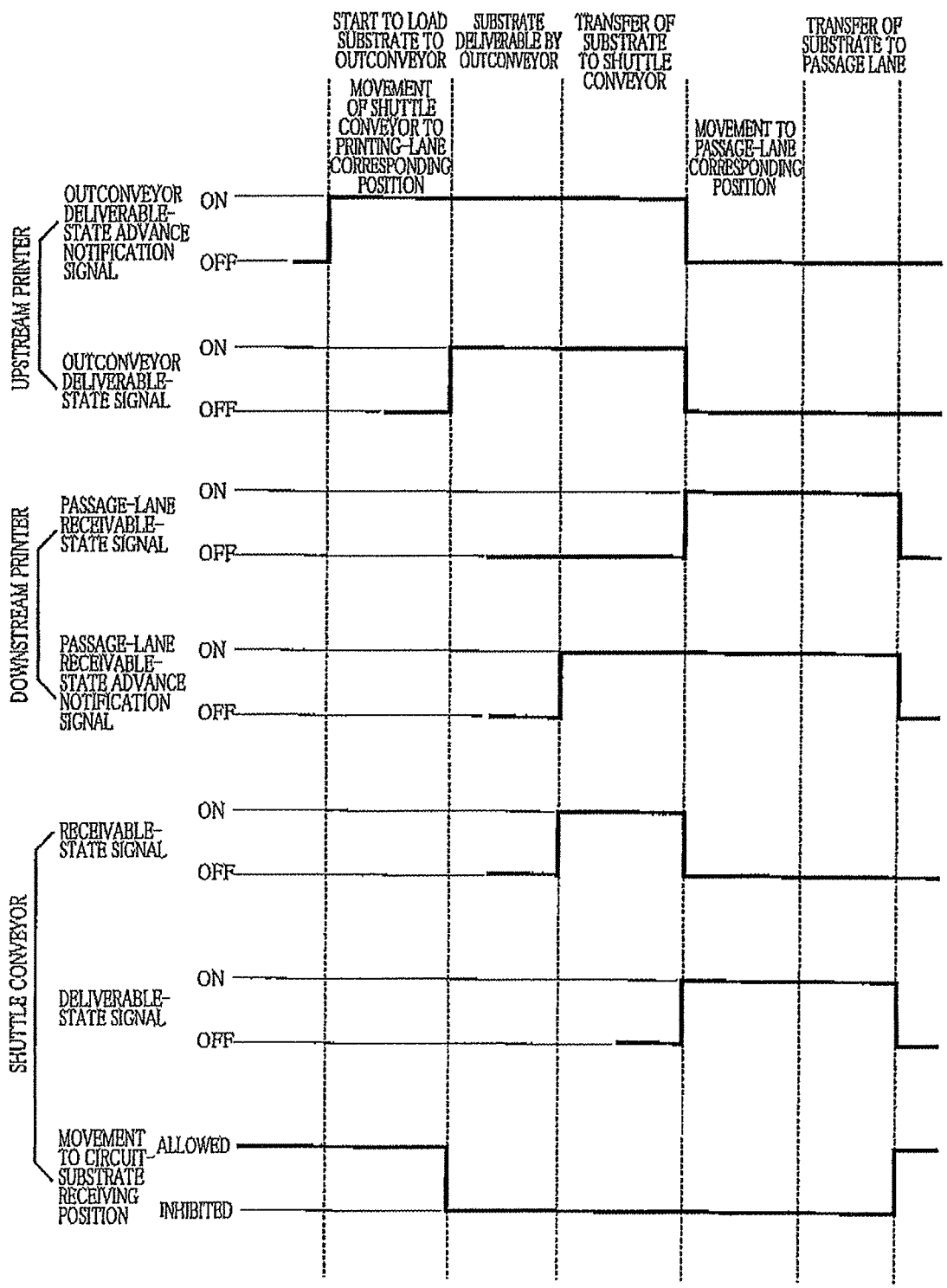
FIG. 8 is a cycle timing diagram for explaining other signals transmitted and received between each of the upstream printer and the downstream printer, and the intermediate shuttle conveyor and for explaining delivery and receipt of the circuit substrate on the basis of the transmission and receipt of said other signals therebetween.

There will be specifically explained, with reference to a cycle timing diagram illustrated in FIG. 8, transmission and receipt of information and delivery and receipt of the circuit substrate 56 between the intermediate shuttle conveyor 12 and each of the upstream and downstream printers 10, as one example transmission and receipt of the information in delivery and receipt of the circuit substrate 56 in a case where solder is printed on the circuit substrate 56 by the upstream printer 10.

In this case, the circuit substrate 56 is conveyed through the path indicated by the solid line in FIG. 5, and when the deliverable-state advance notification signal for the outconveyor 44 becomes ON, the intermediate movable conveyor lane 152 is moved to the printing-lane corresponding position. When the deliverable-state signal for the outconveyor 44 becomes ON in the upstream printer 10, and the receivable-state signal becomes ON in the intermediate shuttle conveyor 12, the circuit substrate 56 is transferred from the outconveyor 44 to the intermediate movable conveyor lane 152. This receivable-state signal becomes ON on condition that the intermediate movable conveyor lane 152 is positioned at the printing-lane corresponding position and that the receivable-state advance notification signal for the passage lane 36 becomes ON in the downstream printer 10. The transfer of the circuit substrate 56 causes the deliverable-state signal to become ON and the receivable-state signal to become OFF in the intermediate shuttle conveyor 12. Also, the deliverable-state signal and the deliverable-state advance notification signal, for the outconveyor 44 are changed to OFF.

When both of the deliverable-state signal and the receivable-state signal become ON between the intermediate shuttle conveyor 12 and the passage lane 36 of the downstream printer 10, the intermediate movable conveyor lane 152 is moved to the passage-lane corresponding position, and the printed circuit substrate 56 is transferred from the intermediate movable conveyor lane 152 to the passage lane 36. When the substrate sensor 84 detects the loading of the circuit substrate 56 onto the passage lane 36 in the downstream printer 10, the receivable-state signal and the receivable-state advance notification signal are changed to OFF. As a result, the deliverable-state signal in the intermediate shuttle conveyor 12 is changed to OFF, and the intermediate movable conveyor lane 152 is allowed to move to the circuit-substrate receiving position, thereby preventing the shifting device 154 from being operated is a state in which the intermediate movable conveyor lane 152 is holding the circuit substrate 56 that is to be delivered to the passage lane 36.

Signals for the lanes 216, 152, 34 between the upstream shuttle conveyor 12 and the substrate supplying machine 8 and between the upstream shuttle conveyor 12 and the upstream printer 10 in the case where the printing is performed in the upstream printer 10 and signals for the lanes 152, 36, 242 between the downstream shuttle conveyor 12 and the downstream printer 10 and between the downstream shuttle conveyor 12 and the most upstream mounting machine 14 are transmitted and received as illustrated in FIG. 6, and an explanation of delivery and receipt of the circuit substrate 56 based on the transmission and receipt of the signals is omitted.

In the present embodiment as described above, the movable conveyor lane 152 of the shuttle conveyor 12 is moved to the circuit-substrate receiving position on the basis of the advance notification information supplied from the upstream device and receives the circuit substrate 56 on the basis of the advance notification information supplied from the downstream device. Thus, a length of time required for the delivery and receipt of the circuit substrate 56 is shortened when compared with a case where no advance notification information is used. The movable conveyor lane 152 may have already been located at the circuit-substrate receiving position upon the transmission of the advance notification information in some order of the delivery and receipt of the circuit substrate 56, but also in such a case, the circuit substrate 56 is received on the basis of the receivable-state advance notification information, which shortens the length of time required for the delivery and receipt.

It is noted that, also in a case where the circuit substrate 56 has a small dimension in the conveying direction and does not project at its upstream portion toward the upstream side from each of the in-conveyor 42 and the outconveyor 44 in a state in which the circuit substrate 56 is loaded onto the conveyors 42, 44 and then stopped by the stopper member 78, the delivery and receipt of the circuit substrate 56 are performed on the basis of the transmission and receipt of the signals as in the case where the circuit substrate 56 projects toward the upstream side. Thus, the movement of the shuttle conveyor 12 to the circuit-substrate receiving position is not allowed until the circuit substrate 56 loaded cm the in-conveyor 42 is loaded onto the main conveyor 40.

In the case where the upstream portion of the loaded circuit substrate 56 does not project toward the upstream side from each of the conveyors 42, 44, being different from the case where the upstream portion projects toward the upstream side, it may be configured that, by considering that the delivery of the circuit substrate 56 is finished after the loading of the circuit substrate 56 onto the in-conveyor 42, the receivable-state signal and the receivable-state advance notification signal are changed to OFF for the printer 10, and the deliverable-state signal is changed to OFF for the shuttle conveyor 12, and the movement of the movable conveyor lane 152 to the circuit-substrate receiving position is allowed. In this configuration, the movable conveyor lane 152 can be moved to the circuit-substrate receiving position according to the deliverable-state advance notification signal that has become ON in the upstream printer 10 or the deliverable-state signal that has become ON in the circuit-substrate supplying machine 8 without waiting for the loading of the circuit substrate 56 from the in-conveyor 42 onto the main conveyor 40.

Even in the event of an unplanned situation in which, for example, the supply of the circuit substrate 56 from the supply lanes 216, 218 and/or the delivery of the circuit substrate 56 from the conveyor lanes 34, 36 of the printer 10 is not performed in the planned other, the delivery and receipt of the circuit substrate 56 can be performed without any problem on the basis of the transmission and receipt of the signals including the advance notification signal. Also, in the present embodiment, the deliverable-state advance notification information is produced for one of the plurality of conveyor lanes of the upstream device, and the movable conveyor lane is moved to the circuit-substrate receiving position on the basis of the deliverable-state advance notification information. Nevertheless, in a case where the deliverable-state advance notification information is produced for another conveyor lane before the receivable-state advance notification information is produced, for example, the movable conveyor lane waits for production of the receivable-state advance notification information for a conveyor lane that is to receive the circuit substrate from the one conveyor lane. When the receivable-state advance notification information is not obtained within a set length of time from the production of the deliverable-state advance notification information for the one conveyor lane, the movable conveyor lane is moved to a position continuous to said another conveyor lane and waits for production of the receivable-state advance notification information for a conveyor lane that is to receive the circuit substrate from said another conveyor lane.

It will be understood from the foregoing explanation that, in the present embodiment, the circuit-substrate supplying machine 8 constitutes an upstream device, and the two printers 10 respectively constitute one of an upstream device and an upstream circuit-substrate working machine, and one of a downstream device and a downstream circuit-substrate working machine. The most upstream mounting machine 14 constitutes a downstream device and a downstream circuit-substrate working machine, and the shuttle conveyor 12 constitutes a substrate conveyor system together with at least one of the upstream device and the downstream device. Also, in the present embodiment, the control device 214 of the circuit-substrate supplying machine 8 constitutes a deliverable-state information producing unit, and the control device 28 of the printer 10 constitutes a deliverable-state information producing unit, a deliverable-state advance-notification-information producing unit, a receivable-state information producing unit, and a receivable-state advance-notification-information producing unit.

Also, the control device 156 of the upstream shuttle conveyor 12 constitutes a deliverable-state information producing unit and a receivable-state information producing unit and constitutes a shuttle-conveyor control unit including a receipt control unit. The control device 156 of each of the intermediate and downstream shuttle conveyors 12 constitutes a deliverable-state information producing unit and a receivable-state information producing unit and constitutes a shuttle-conveyor control unit including an advance-shift control unit and a receipt control unit. It is also possible to consider that the deliverable-state information producing unit and the receivable-state information producing unit are included in the shuttle-conveyor control unit.

Also, the control device 238 of the most upstream mounting machine 14 constitutes a receivable-state information producing unit and a receivable-state advance-notification-information producing unit. Also, the control device 238 of each of the mounting machines 14 constitutes a receivable-state information producing unit and a receipt control unit for controlling the receipt of the circuit substrate 56, and the control device 238 of the mounting machine 14 which produces the deliverable-state information constitutes a deliverable-state information producing unit and a delivery control unit. The control device 28 of the printer 10 also constitutes a delivery control unit configured to control the conveyor lanes 34, 36 to deliver the circuit substrate 56 to the movable conveyor lane 152. The control device 214 of the circuit-substrate supplying machine 8 also constitutes a delivery control unit. The delivery control unit constitutes, together with the receipt control unit of the shuttle conveyor 12, a delivery and receipt control unit configured to control the delivery and receipt of the circuit substrate 56 in the circuit-substrate working system and the substrate conveyor system. The shuttle-conveyor control unit also includes a shuttle-side delivery control unit configured to control the delivery of the circuit substrate 56 of the printer 10 or the mounting'machine 14. Portions of the control devices 28, 238 which control the receipt of the circuit substrate 56 constitute a working-machine-side receipt control unit. These control units constitute a delivery and receipt control unit in the above-described system. Also, a delivery control unit of one of the control devices 238 of the adjacent two mounting machines 14 and a receipt control unit of the other of the control devices 238 constitute the delivery and receipt control unit in the above-described system.

It is not essential that, for the shuttle conveyor, the shift of the movable conveyor lane from the circuit-substrate receiving position to the circuit-substrate delivery position is included in the circuit-substrate delivery and receipt operation performed in the state in which the deliverable-state information and the receivable-state information are obtained. The shift may be considered as an operation different from the delivery and receipt operation. As such an embodiment, there will be next explained, with reference to FIGS. 9 and 10, delivery and receipt of the circuit substrate between the intermediate shuttle conveyor 12 and each of the upstream and downstream printers 10 by way of example.

Figure 9:
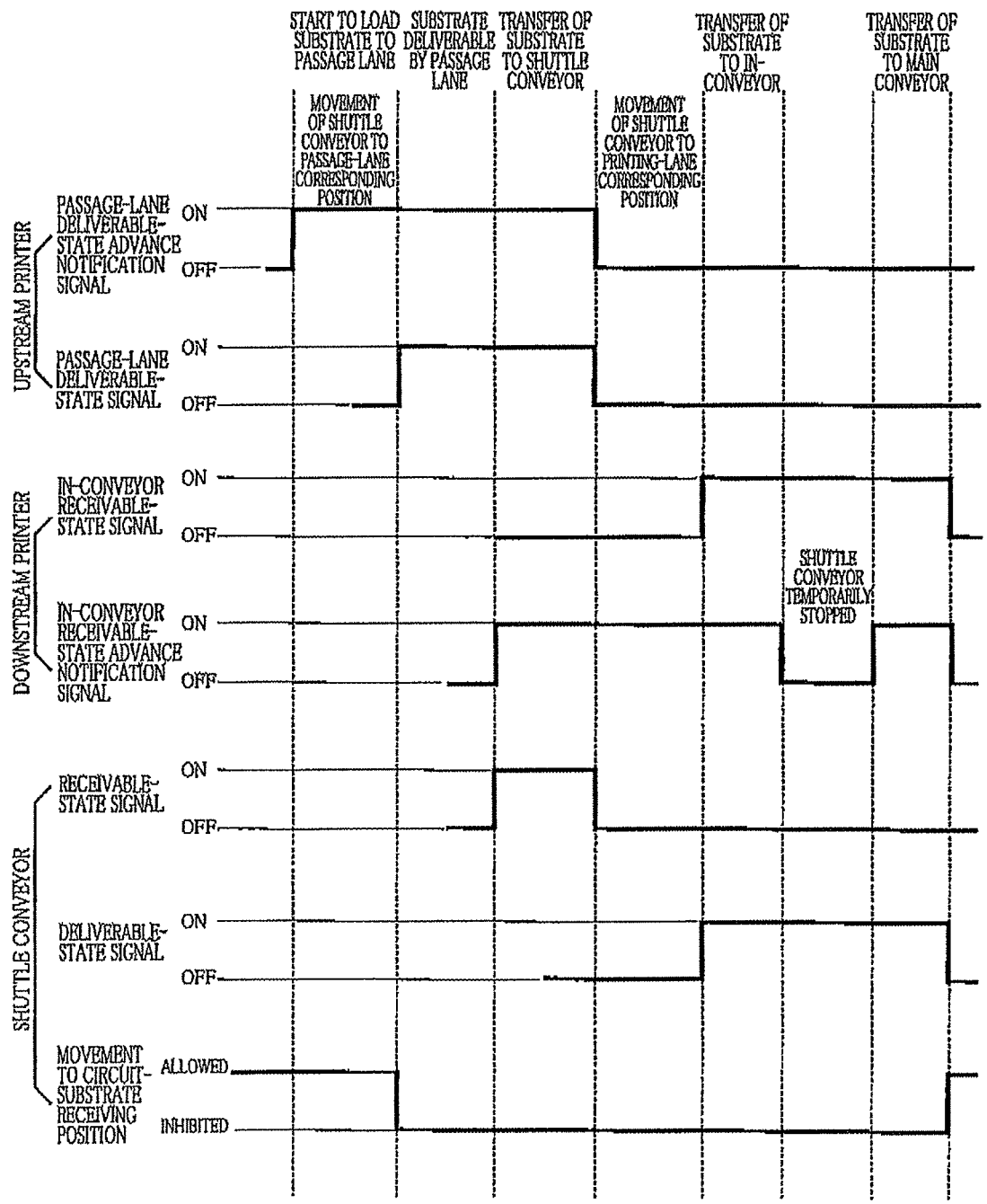
FIG. 9 is a cycle timing diagram, for explaining signals transmitted and received between an upstream printer and a downstream printer, and an intermediate shuttle conveyor of an electronic-circuit assembling system according to another embodiment and for explaining delivery and receipt of a circuit substrate on the basis of the transmission and receipt of the signals therebetween.

As illustrated in FIG. 9, among the signals transmitted and received when the intermediate shuttle conveyor 12 receives the circuit substrate 56 from the passage lane 36 of the upstream printer 10 and delivers the circuit substrate 56 to the printing lane 34 of the downstream printer 10, the deliverable-state advance notification signal, the receivable-state advance notification signal for the printing lane 34, and the receivable-state signal for the intermediate shuttle conveyor 12 are transmitted in a similar manner to that in the above-described embodiment. On the basis of these signals, the movement of the intermediate movable conveyor lane 152 to the passage-lane corresponding position and the receipt of the circuit substrate 56 are performed, but after the receipt of the circuit substrate 56, the deliverable-state signal for the intermediate shuttle conveyor 12 is not changed to ON, and the movable conveyor lane 152 is immediately moved to the printing-lane corresponding position. After the movement, the deliverable-state signal for the intermediate shuttle conveyor 12 is changed to ON.

When both of the deliverable-state signal and the receivable-state signal become ON between the intermediate movable conveyor lane 152 and the printing lane 34, the circuit substrate 56 starts to be transferred from the intermediate movable conveyor lane 152 to the in-conveyor 42 of the printing lane 34. Timings of supply of operating commands to the movable conveyor 160 and the stopper member 180 of the movable conveyor lane 152 and the in-conveyor, 42 in this transfer are the same as those in the transfer of the circuit substrate 56 from the passage lane 36 to the movable conveyor lane 152. Operations thereafter are the same as those in the above-described embodiment, and an explanation therefor is omitted.

Figure 10:
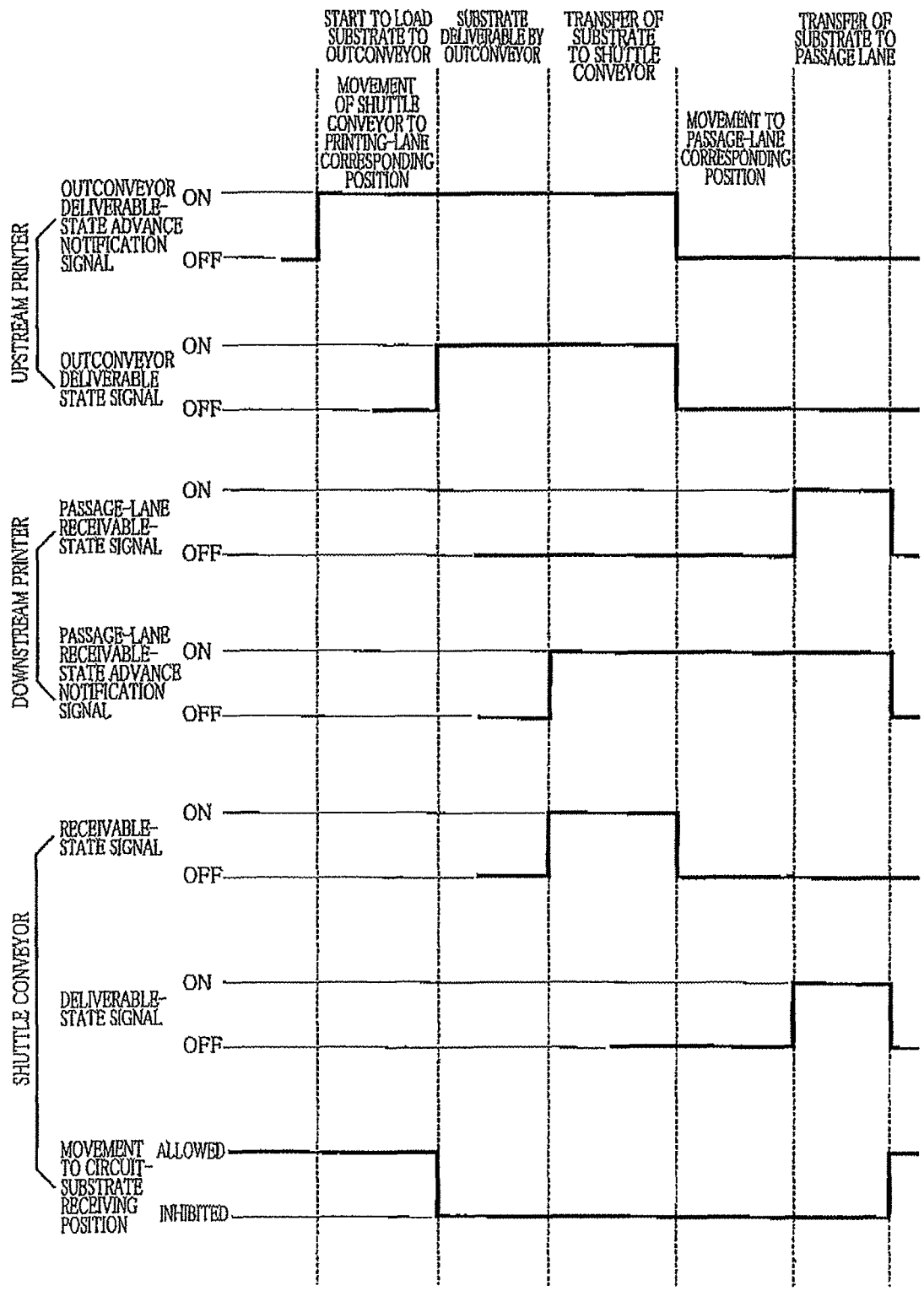
FIG. 10 is a cycle timing diagram for explaining other signals transmitted and received between the upstream printer and the downstream printer, and the intermediate shuttle conveyor of the electronic-circuit assembling system designed to perform the delivery and receipt of the circuit substrate on the basis of the transmission and receipt of the signals illustrated in FIG. 9 and for explaining delivery and receipt of the circuit substrate on the basis of the transmission and receipt of said other signals therebetween.

Also in a case where the intermediate movable conveyor lane 152 receives the printed substrate 56 from the printing lane 34 of the upstream printer 10 and delivers the printed substrate 56 to the passage lane 36 of the downstream printer 10, as illustrated in FIG. 10, the deliverable-state signal for the intermediate shuttle conveyor 12 becomes ON in a state in which the intermediate movable conveyor lane 152 is positioned at the passage-lane corresponding position. The printed substrate 56 is then transferred in a state in which the deliverable-state signal and the receivable-state signal become ON for the intermediate shuttle conveyor 12 and the passage lane 36.

In the present embodiment, the shuttle conveyors 12 receives the circuit substrate 56 from an upstream system's constituent device on the basis of the receivable-state advance notification signal, resulting in reduction in the delivery and receipt time. In addition, the movable conveyor lime 152 is immediately moved from the circuit-substrate receiving position to the circuit-substrate delivery position after the receipt of the circuit substrate 56, also resulting in reduction in the delivery and receipt time. These time reductions are obtained because it is possible to use (i) the set length of time for transmitting the receivable-state advance notification signal before the transmission of the deliverable-state and receivable-state signals and (ii) a difference between the timing when the receivable-state advance notification signal becomes ON and the timing when the receivable-state signal becomes ON, for not only the receipt of the circuit substrate 56 but also the shift of the movable conveyor lane 152.

The shuttle-conveyor control unit may be provided in the control device of the printer. There will be next explained such an embodiment with reference to FIG. 11.

Figure 11:
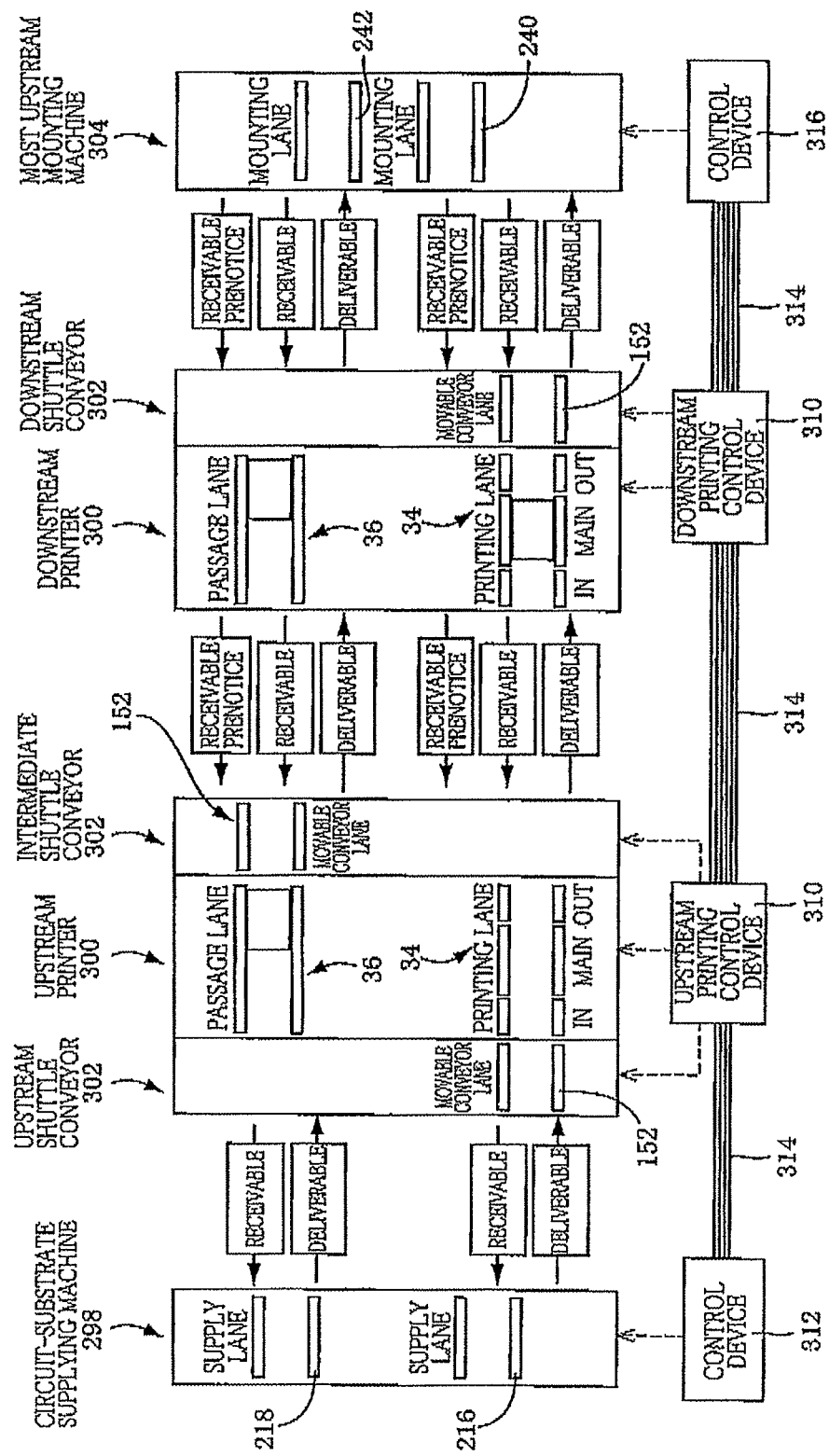
FIG. 11 is a view for explaining transmission and receipt of signals in an electronic-circuit assembling system according to another embodiment.

Like the electronic-circuit assembling system according to the above-described embodiment, an electronic-circuit assembling system according to the present embodiment includes a circuit-substrate supplying machine 298, two printers 300, three shuttle conveyors 302, and eight mounting machines 304 (FIG. 11 illustrates only the most upstream one of the mounting machines 304). A control device 310 of the upstream printer 300 (hereinafter referred to as "upstream printing control device 310") controls the upstream shuttle conveyor 302 and the intermediate shuttle conveyor 302, and a control device 310 of the downstream printer 300 (hereinafter referred to as "downstream printing control device 310") controls the downstream shuttle conveyor 302. The machines and devices such as the circuit-substrate supplying machine 298 are similar in structure to those in the above-described embodiment. Thus, the same reference numerals will, be used for functionally corresponding elements to identify their correspondences, and an explanation therefor is omitted. It is noted that, in the present embodiment, the conveyor main body 150 of each of the upstream shuttle conveyor 302 and the intermediate shuttle conveyor 302 is provided integrally with the printer main body 20 of the upstream printer 300. The downstream shuttle conveyor 302 and the downstream printer 300 have the same structure.

A computer of a control device 312 of the circuit-substrate supplying machine 298 and a computer of the upstream printing control device 310 are connected to each other by four signal lines 314, and as in the above-described embodiment, signals are transmitted and received between the upstream shuttle conveyor 302 and each of the two supply lanes 216, 218. Computers of the respective upstream and downstream printing control devices 310 are connected to each other by six signal lines 314, and signals are transmitted and received between the intermediate shuttle conveyor 302 and each of the printing lane 34 and the passage lane 36 of the downstream printer 10. Also, a computer of the downstream printing control device 310 and a computer of a control device 316 of the most upstream mounting machine 304 are connected to each other by six signal lines 314, and signals are transmitted and received between the downstream shuttle conveyor 302 and each of the two mounting lanes 240, 242 of the mounting machine 304.

Each of the upstream and downstream printing control devices 310 grasps not only printing progress and circuit-substrate passing progress in the printer 300 but also circuit-substrate conveying progress in the shuttle conveyor 302, e.g., the presence or absence of the circuit substrate 56 on the movable conveyor lane 152 and a position of the movable conveyor lane 152. Thus, the printing control device 310 can obtain information obtained by the transmission and receipt of the signals for the shuttle conveyor 302 and can control the devices and machines such as the shuttle conveyors 302 on the basis of the information produced in the computer and the information transmitted by the signal lines 314, to perform the delivery and receipt of the circuit substrate at the timing that is the same as that of any of the above-described two embodiments.

In the present embodiment, the upstream printing control device 310 constitutes a deliverable-state information producing unit and a receivable-state information producing unit of the upstream shuttle conveyor 302, constitutes: a shuttle-conveyor control unit including a receipt control unit; a deliverable-state information producing unit and a receivable-state information producing unit of the intermediate shuttle conveyor 302; and a shuttle-conveyor control unit including an advance-shift control unit and the receipt control unit. Also, the downs ream printing control device 310 constitutes: a deliverable-state information producing unit and a receivable-state information producing unit of the downstream shuttle conveyor 302; and a shuttle-conveyor control unit including an advance-shift control unit and a receipt control unit. It is also possible to consider that the deliverable-state information producing unit and the receivable-state information producing unit are included in the shuttle-conveyor control unit. The upstream printing control device 310 constitutes: a delivery control unit for delivering the circuit substrate 56 from the upstream shuttle conveyor 302 to the upstream printer 300; a receipt control unit configured to control the upstream printer 300 to receive the circuit substrate 56 from the upstream shuttle conveyor 302; and a delivery control unit configured to control the conveyor lanes 34, 36 to deliver the circuit substrate 56 to the intermediate movable conveyor lane 152. These control units constitute: a delivery and receipt control unit together with the receipt control unit of the intermediate shuttle conveyor 302. The downstream printing control device 310 constitutes: a delivery control unit configured to control the conveyor lanes 34, 36 to deliver the circuit substrate 56 to the downstream movable conveyor lane 152; and a delivery and receipt control unit together with the receipt control unit of the downstream shuttle conveyor 302. Also, the control device 312 of the circuit-substrate supplying machine 298 constitutes a delivery control unit, the upstream printing control device 310 constitutes a shuttle-side delivery control unit for the intermediate shuttle conveyor 302, the downstream, printing control device 310 constitutes a working-machine-side receipt control unit and a shuttle-side delivery control unit for the downstream shuttle conveyor 302, the control device 316 of the most upstream mounting machine 304 constitutes a working-machine-side receipt control unit, and these controls units constitute a delivery and receipt control unit in the circuit-substrate working system and the substrate conveyor system together with the receipt control unit for the upstream shuttle conveyor 302. The other control functions of the upstream and downstream printing control devices 310 and control functions of the control devices 312, 316 are the same as those in the above-described embodiment, and an explanation therefore is omitted.

In the present embodiment, it is possible to consider that the printing control device 310 includes a portion for controlling the printer 300 and a portion for controlling the shift of the movable conveyor lane 152 of the shuttle conveyor 302 and the delivery and receipt of the circuit substrate 56 by the movable conveyor lane 152 and that the printing control device 310 also acts as a control device constituting devices such as the shuttle-conveyor control unit for the shuttle conveyor. Also in the present embodiment, it is possible to consider that the upstream shuttle conveyor 302 includes the receipt control unit, that each of the intermediate and downstream shuttle conveyors 302 includes the advance-shift control unit and the receipt control unit, and that any of the shuttle conveyors 302 includes the deliverable-state information producing unit and the receivable-state information producing unit.

It is noted that it may be configured that the upstream and downstream control devices 310 are connected to each other by communication lines instead of the signal lines 314 to transmit and receive information about the movable conveyor lane 152 of the intermediate shuttle conveyor 302 which is obtained by each control device 310 and information about the in-conveyor 42 and the passage lane 36 of the upstream printer 300, and the movable conveyor lane 152, the in-conveyor 42, and the passage lane 36 are controlled on the basis of the informations. This configuration can be applied to the circuit-substrate supplying machine 298 and the upstream printing control device 310, and the downstream printing control device 310 and the control device 316 of the most upstream mounting machine 14.

Figure 12:
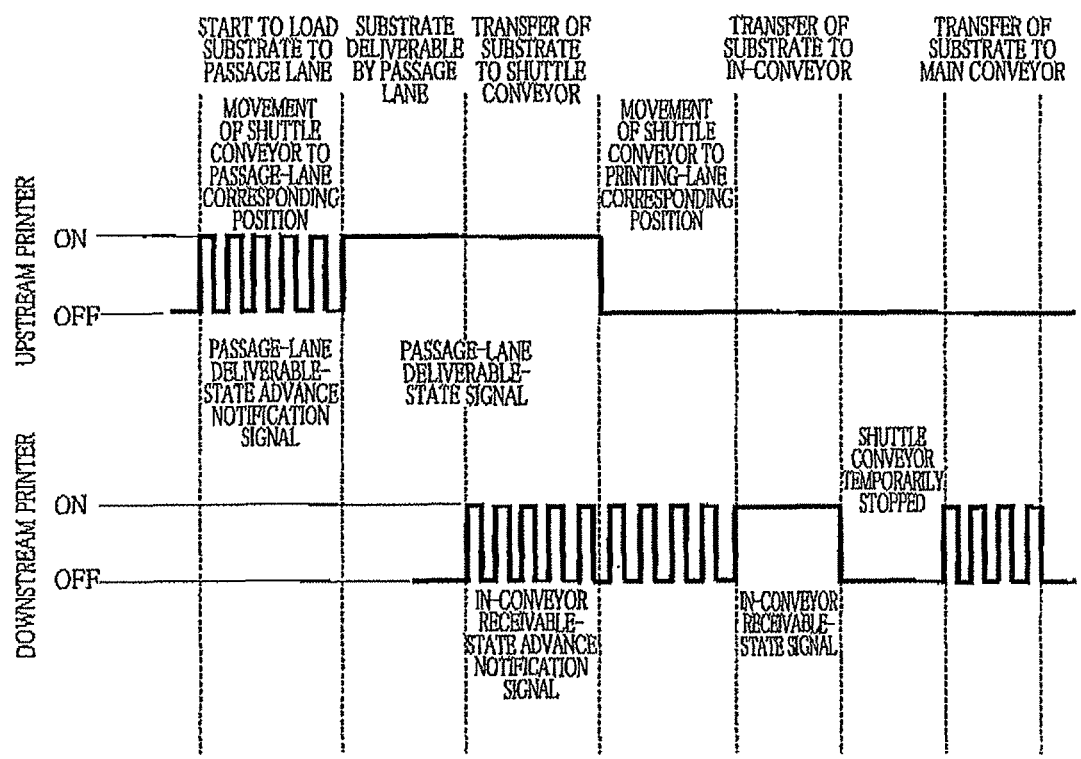
FIG. 12 is a view for explaining transmission, through a common signal line, of an advance notification signal and a signal indicative of a realization of a situation notified in advance, among signals transmitted and received in the electronic-circuit assembling system.

At least one set of the deliverable-state advance notification signal and the deliverable-state signal, and the receivable-state advance notification signal and the receivable-state signal may be transmitted by a common signal line. For example, as illustrated in FIG. 12, the advance notification signal is constituted by a signal that repeats an ON state and an OFF state in a short cycle, and each of signals other than the advance notification signal is constituted by a signal that keeps an ON state, and vice versa. A computer that receives the Signals is configured to distinguish between the two types of signals by detecting changes of the signals from OFF to ON and from ON to OFF and duration and production cycles of the ON signal.

A circuit for recognizes, e.g., the change of the above-described signal from OFF to ON to distinguish between the two types of signals.

The shuttle conveyor between the circuit-substrate supplying machine and the printer may be omitted. For example, the supply lanes of the circuit-substrate loading device and the conveyor lanes of the printer are provided at the same positions in a direction intersecting the conveying direction, and the circuit substrate is supplied from the circuit-substrate supplying machine directly to the printer. In a case where the system is designed such that the circuit substrate is supplied to the printer by an operator, the circuit-substrate supplying machine can be omitted.

Also, the presence or absence of the circuit substrate on each conveyor lane may be recognized and detected by a device that differs from the substrate sensor. For example, the circuit substrate is made deliverable by an operation of the conveyor of the conveyor lane upon its receipt of the circuit substrate or by continuing a set length of time for the conveyance in addition to the operation of the conveyor.

Also, the shuttle conveyor may be provided between adjacent two of a plurality of mounting machines arranged in a row. For example, in a case where the shuttle conveyor is provided between adjacent two of a plurality of mounting machines, each having the same structure as the mounting machine 14, arranged in a row, various forms of mounting are enabled. For example, electronic circuit components may be mounted using two mounting lanes in each mounting machine arranged upstream of the shuttle conveyor, and electronic circuit components are mounted using only a single mounting lane nearer to the component supplying device in each mounting machine arranged downstream of the shuttle conveyor. Alternatively, a mounting lane farther from the component supplying device may be used as the passage lane, for example. In a case where the deliverable-state advance notification information is produced for the mounting lanes 240, 242 of the upstream mounting machine 14, and/or the receivable-state advance notification information is produced for the mounting lanes 240, 242 of the downstream mounting machine 14, and the shift of the movable conveyor lane and the receipt of the circuit substrate are performed by the shuttle conveyor on the basis of the advance notification information, a length of time required for the delivery and receipt of the circuit substrate is reduced.

Explanation of Reference Numerals

10: screen printing machine, 12: shuttle conveyor, 14: electronic-circuit-component mounting machine, 34, 36: conveyor lane, 152: movable conveyor lane, 260: signal line

The invention claimed is:

1. A shuttle conveyor provided downstream of an upstream device comprising a multi-lane conveyor device comprising a plurality of conveyor lanes each for conveying a circuit substrate from an upstream side toward a downstream side, the shuttle conveyor comprising: a movable conveyor lane; and a shifting device configured to shift the movable conveyor lane in a direction intersecting a conveying direction in which the movable conveyor lane conveys the circuit substrate,
wherein the shuttle conveyor further comprises an advance-shift control unit configured, when deliverable-state advance notification information is obtained for one of the plurality of conveyor lanes of the upstream device before the one becomes a state in which the circuit substrate is deliverable, to have the shifting device shift the movable conveyor lane to a position at which the circuit substrate is receivable by the movable conveyor lane from the one of the plurality of conveyor lanes, the deliverable-state advance notification information being a notification which notifies in advance that the one is to become the state in which the circuit substrate is deliverable.

2. A shuttle conveyor provided between a downstream device and an upstream device comprising a multi-lane conveyor device comprising a plurality of conveyor lanes each for conveying a circuit substrate from an upstream side toward a downstream side, the shuttle conveyor comprising: a movable conveyor lane; and a device configured to shift the movable conveyor lane in a direction intersecting a conveying direction in which the movable conveyor lane conveys the circuit substrate,
wherein the shuttle conveyor further comprises a receipt control unit configured, when a circuit substrate is present on one of the plurality of conveyor lanes, and receivable-state advance notification information is obtained from the downstream device before the downstream device becomes a state in which the circuit substrate is receivable, to have the movable conveyor lane receive the circuit substrate from the one of the plurality of conveyor lanes, the receivable-state advance notification information being a notification which notifies in advance that the downstream device is to become the state in which the circuit substrate is receivable.

3. A shuttle conveyor provided between an upstream device and a downstream device and comprising a movable conveyor lane and a shifting device configured to shift the movable conveyor lane in a direction intersecting a conveying direction in which the movable conveyor lane conveys the circuit substrate,
wherein the shuttle conveyor further comprises:
an advance-shift control unit configured, when deliverable-state advance notification information is obtained from the upstream device before the upstream device becomes a state in which a circuit substrate is deliverable, to have the shifting device shift the movable conveyor lane to a position at which the circuit substrate is receivable by the movable conveyor lane from the upstream device, the deliverable-state advance notification information being a notification which notifies in advance that the upstream device is to become the state in which the circuit substrate is deliverable; and
a receipt control unit configured, when a circuit substrate is present on the upstream device, and receivable-state advance notification information is obtained from the downstream device before the downstream device becomes a state in which the circuit substrate is receivable, to have the movable conveyor lane receive the circuit substrate from the upstream device, the receivable-state advance notification information being a notification which notifies in advance that the downstream device is to become the state in which the circuit substrate is receivable.

4. A shuttle conveyor provided between an upstream device comprising a multi-lane conveyor device comprising a plurality of conveyor lanes each for conveying a circuit substrate from an upstream side toward a downstream side and a downstream device comprising a multi-lane conveyor device comprising a plurality of conveyor lanes each for conveying a circuit substrate from the upstream side toward the downstream side, the shuttle conveyor comprising: a movable conveyor lane; and a shifting device configured to selectively shift the movable conveyor lane to one of a plurality of positions respectively continuous to the plurality of conveyor lanes of the multi-lane conveyor device of the upstream device and the plurality of conveyor lanes of the multi-lane conveyor device of the downstream device,
wherein the shuttle conveyor comprises at least one of:
an advance-shift control unit configured, when deliverable-state advance notification information is obtained from one of the plurality of conveyor lanes of the upstream device, to shift the movable conveyor lane to a position continuous to the one of the plurality of conveyor lanes, the deliverable-state advance notification information being a notification which notifies in advance that the one of the plurality of conveyor lanes is to become a state in which the circuit substrate is deliverable; and
a receipt control unit configured, when a circuit substrate present on one of the plurality of conveyor lanes of the upstream device, and receivable-state advance notification information is obtained from one of the plurality of conveyor lanes of the downstream device, to have the movable conveyor lane receive the circuit substrate from the one of the plurality of conveyor lanes of the upstream device, the receivable-state advance notification information being a notification which notifies in advance that the one of the plurality of conveyor lanes of the upstream device is to become a state in which the circuit substrate is receivable.

5. A circuit-substrate working machine comprising:
a substrate conveyor device configured to convey a circuit substrate from an upstream side toward a downstream side;
a working device configured to perform a circuit Substrate operation on the circuit substrate conveyed by the substrate conveyor device; and
a deliverable-state advance-notification-information producing unit configured to produce deliverable-state advance notification information a first set length of time before a timing at which the working device is expected to finish the circuit substrate operation,
wherein the substrate conveyor device is a multi-lane conveyor device comprising a plurality of conveyor lanes each for conveying the circuit substrate from the upstream side toward the downstream side, and
wherein the deliverable-state advance-notification-information producing unit is configured to produce the deliverable-state advance notification information for at least one of the plurality of conveyor lanes which conveys the circuit substrate to the working device.

6. A circuit-substrate working machine comprising: a substrate conveyor device configured to convey a circuit substrate from an upstream side toward a downstream side;
a working device configured to perform a circuit substrate operation on the circuit substrate conveyed by the substrate conveyor device; and
a receivable-state advance-notification-information producing unit configured to produce receivable-state advance notification information a second set length of time before a timing at which the working device is expected to finish the circuit substrate operation,
wherein the substrate conveyor device is a multi-lane conveyor device comprising a plurality of conveyor lanes each for conveying the circuit substrate from the upstream side toward the downstream side, and
wherein the receivable-state advance-notification information producing unit is configured to produce the receivable-state advance notification information for at least one of the plurality of conveyor lanes which conveys the circuit substrate to the working device.

7. A circuit-substrate working system comprising:
an upstream circuit-substrate working machine comprising: (a) a substrate conveyor device configured to convey a circuit substrate from an upstream side toward a downstream side; (b) a working device configured to perform a circuit substrate operation on the circuit substrate conveyed by the substrate conveyor device; and (c) a deliverable-state advance-notification-information producing unit configured to produce deliverable-state advance notification information a first set length of time before a timing at which the working device is expected to finish the circuit substrate operation;
a downstream circuit-substrate working machine comprising: (d) a substrate conveyor device configured to convey a circuit substrate from the upstream side toward the downstream side; (e) a working device configured to perform a circuit substrate operation on the circuit substrate conveyed by the substrate conveyor device; (f) a receivable-state advance-notification information producing unit configured to produce receivable-state advance notification information a second set length of time before a timing at which the working device is expected to finish the circuit substrate operation;
(g) a shuttle-conveyor provided between the upstream circuit-substrate working machine and the downstream circuit-substrate working machine and comprising a movable conveyor lane and a shifting device configured to shift the movable conveyor lane in a direction intersecting a conveying direction in which the movable conveyor lane conveys the circuit substrate;
(h) an advance-shift control unit configured, when the deliverable-state advance notification information is obtained from the upstream device, to have the shifting device shift the movable conveyor lane to a position at which the circuit substrate is receivable by the movable conveyor lane from the upstream device; and
(i) a receipt control unit configured, when a circuit substrate is present on the upstream device, and the receivable-state advance notification information is obtained from the downstream device, to have the movable conveyor lane receive the circuit substrate from the upstream device.

8. The circuit-substrate working system according to claim 7,
wherein each of the substrate conveyor device of the upstream circuit-substrate working machine and the substrate conveyor device of the downstream circuit-substrate working machine is a multi-lane conveyor device comprising a plurality of conveyor lanes each for conveying a circuit substrate from the upstream side toward the downstream side,
wherein the advance-shift control unit is configured, when, the deliverable-state advance notification, information is obtained for one of the plurality of conveyor lanes of the upstream circuit-substrate working machine, to have the shifting device shift the movable conveyor lane to a position at which the circuit substrate is receivable by the movable conveyor lane from the one of the plurality of conveyor lanes, and
wherein the receipt control unit is configured, when the receivable-state advance notification information is obtained for one of the plurality of conveyor lanes of the downstream circuit-substrate working machine, to have the movable conveyor lane receive the circuit substrate from the substrate conveyor device of the upstream circuit-substrate working machine at the position at which the movable conveyor lane has been shifted by the advance-shift control unit.

9. The circuit-substrate working system according to claim 8, wherein each of the upstream circuit-substrate working machine and the downstream circuit-substrate working machine is configured to perform the same kind of operation on a circuit substrate on a frontmost one of the plurality of conveyor lanes of the multi-lane conveyor device.

10. The circuit-substrate working system according to claim 7, wherein a shuttle-conveyor control unit configured to control the shuttle conveyor is provided on at least one of the upstream circuit-substrate working machine and the downstream circuit substrate working machine.

11. The circuit-substrate working system according to claim 7,
wherein the shuttle conveyor comprises a shuttle-conveyor control unit configured to control the shuttle conveyor, and
wherein the shuttle-conveyor control unit and at least one of the upstream circuit-substrate-working machine and the downstream circuit-substrate-working machine are coupled to each other by a signal line that transmits and receives a signal representative of at least one of the deliverable-state advance notification information and the receivable-state advance notification information.

12. The circuit-substrate working system according to claim 10,
wherein another shuttle conveyor different from the shuttle conveyor is provided on at least one of an upstream side of the upstream circuit-substrate working machine and a downstream side of the downstream circuit-substrate working machine, said another shuttle conveyor comprising a shuttle-conveyor control unit configured to control said another shuttle conveyor, and
wherein the shuttle-conveyor control unit and the at least one of the upstream circuit-substrate working machine and the downstream circuit-substrate working machine are coupled to each other by a signal line that transmits and receives a signal representative of at least one of the deliverable-state advance notification information and the receivable-state advance notification information.

13. The circuit-substrate working system according to claim 10,
wherein another shuttle conveyor different from the shuttle conveyor is provided on at least one of an upstream side of the upstream circuit-substrate working machine and a downstream side of the downstream circuit-substrate working machine, and
wherein a shuttle-conveyor control unit configured to control said another shuttle conveyor is provided on the at least one of the upstream circuit-substrate working machine and the downstream circuit-substrate working machine.

14. The circuit-substrate working system according to claim 11,
wherein at least one of the upstream circuit-substrate working machine and the downstream circuit-substrate working machine comprises at least one of a deliverable-state information producing unit configured to produce deliverable-state information when the at least one of the upstream circuit-substrate working machine and the downstream circuit-substrate working machine completes the circuit substrate operation; and a receivable-state information producing unit configured to produce receivable-state information when the at least one of the upstream circuit-substrate working machine and the downstream circuit-substrate working machine completes the circuit substrate operation, and
wherein the at least one of the upstream circuit-substrate working machine and the downstream circuit-substrate working machine is configured to transmit a signal representative of the deliverable-state information and a signal representative of the deliverable-state advance notification information, or a signal representative of the receivable-state information and a signal representative of the receivable-state advance notification information, to the signal line in different manners.

* * * * *